(12) United States Patent
Noda

(10) Patent No.: US 7,560,297 B2
(45) Date of Patent: *Jul. 14, 2009

(54) ACTIVE MATRIX SUBSTRATE, MANUFACTURING METHOD THEREOF, ELECTRO-OPTICAL DEVICE, AND ELECTRONIC APPARATUS

(75) Inventor: Yoichi Noda, Fujimi (JP)

(73) Assignee: Seiko Epson Corporation (JP)

( * ) Notice: Subject to any disclaimer, the term of this patent is extended or adjusted under 35 U.S.C. 154(b) by 146 days.

This patent is subject to a terminal disclaimer.

(21) Appl. No.: 11/556,771

(22) Filed: Nov. 6, 2006

(65) Prior Publication Data

US 2007/0111507 A1    May 17, 2007

(30) Foreign Application Priority Data

Nov. 16, 2005    (JP) ............................. 2005-331439

(51) Int. Cl.
  *H01L 21/20* (2006.01)
(52) U.S. Cl. .................. 438/34; 438/584; 438/763
(58) Field of Classification Search .................. 438/29, 438/30, 34, 58, 99, 141, 584, 763; 257/E21.001; 427/66; 445/24
  See application file for complete search history.

(56) References Cited

U.S. PATENT DOCUMENTS 5,930,607 A    7/1999    Satou

| 7,282,779 B2 | 10/2007 | Hasei |
|---|---|---|
| 2005/0058840 A1 | 3/2005 | Toyoda |
| 2005/0072974 A1 | 4/2005 | Nakamura et al. |
| 2006/0044486 A1* | 3/2006 | Noda et al. .................. 349/43 |
| 2006/0046359 A1* | 3/2006 | Noda et al. .................. 438/149 |

FOREIGN PATENT DOCUMENTS

| JP | 11-274671 | 10/1999 |
|---|---|---|
| JP | 2000-216330 | 8/2000 |
| JP | 3261699 | 12/2001 |
| JP | 2005-012181 | 1/2005 |
| JP | 2005-62355 | 3/2005 |
| JP | 2005-129922 | 5/2005 |
| JP | 2005-159143 | 6/2005 |
| KR | 10-2004-010377 | 12/2004 |

* cited by examiner

*Primary Examiner*—Savitri Mulpuri
(74) *Attorney, Agent, or Firm*—Harness, Dickey & Pierce, P.L.C.

(57) ABSTRACT

A method for manufacturing an active matrix substrate, comprises forming a first conductive layer across a first wiring line forming area and a second wiring line forming area on a substrate including a first wiring line and a second wiring line having a width narrower than a width of the first wiring line, and forming a second conductive layer on the first conductive layer formed in the first wiring line forming area in a layered state, and on the first conductive layer formed in the second wiring line forming area in a non-layered state.

5 Claims, 19 Drawing Sheets

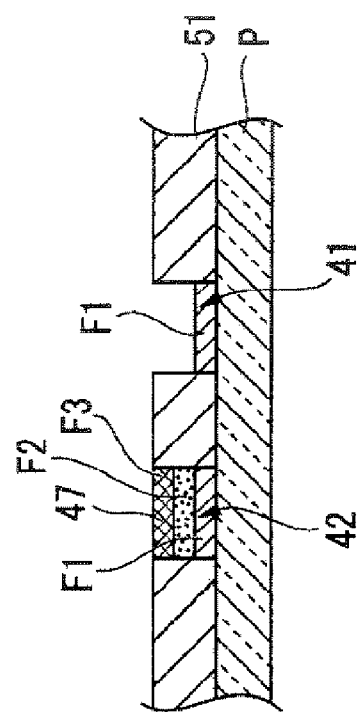
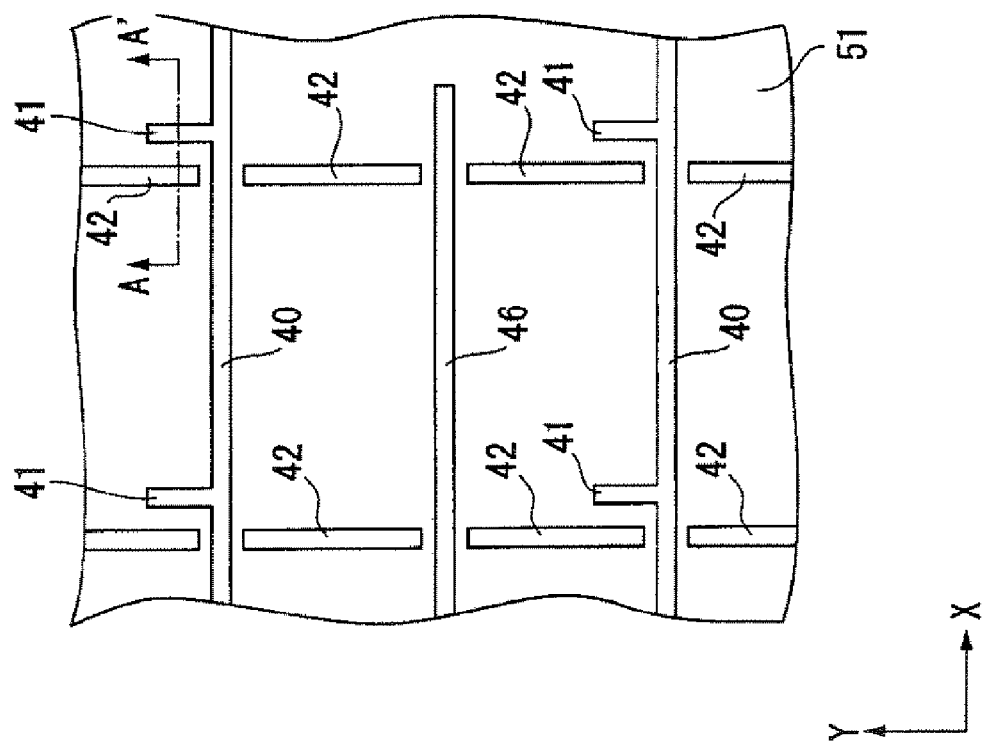
FIG. 6B
FIG. 6A

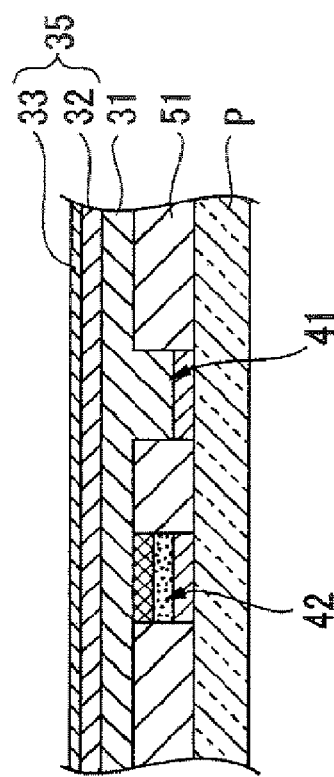
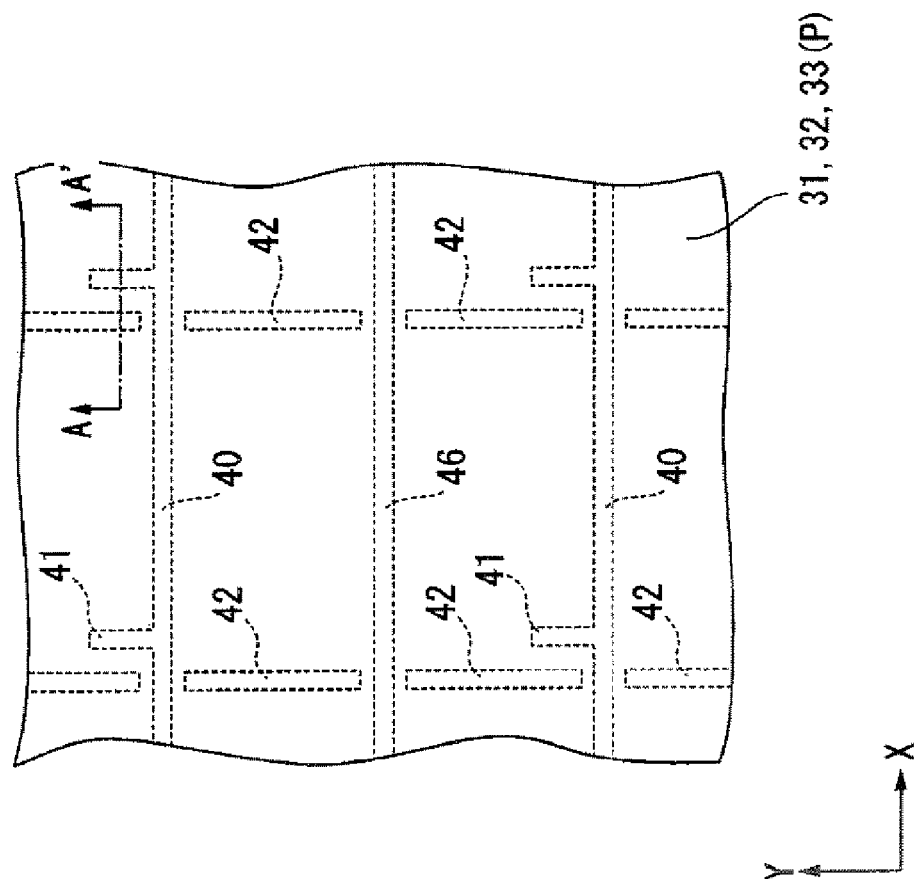
FIG.11B
FIG.11A

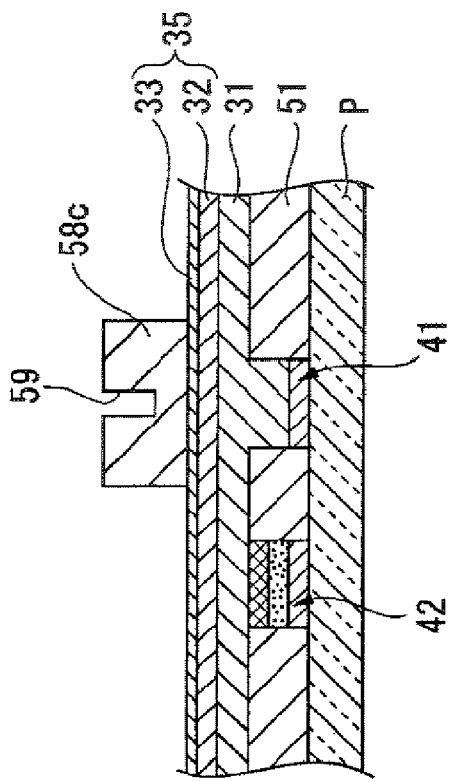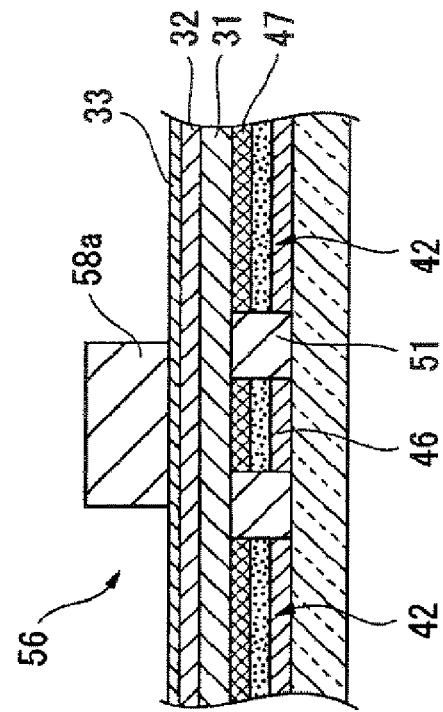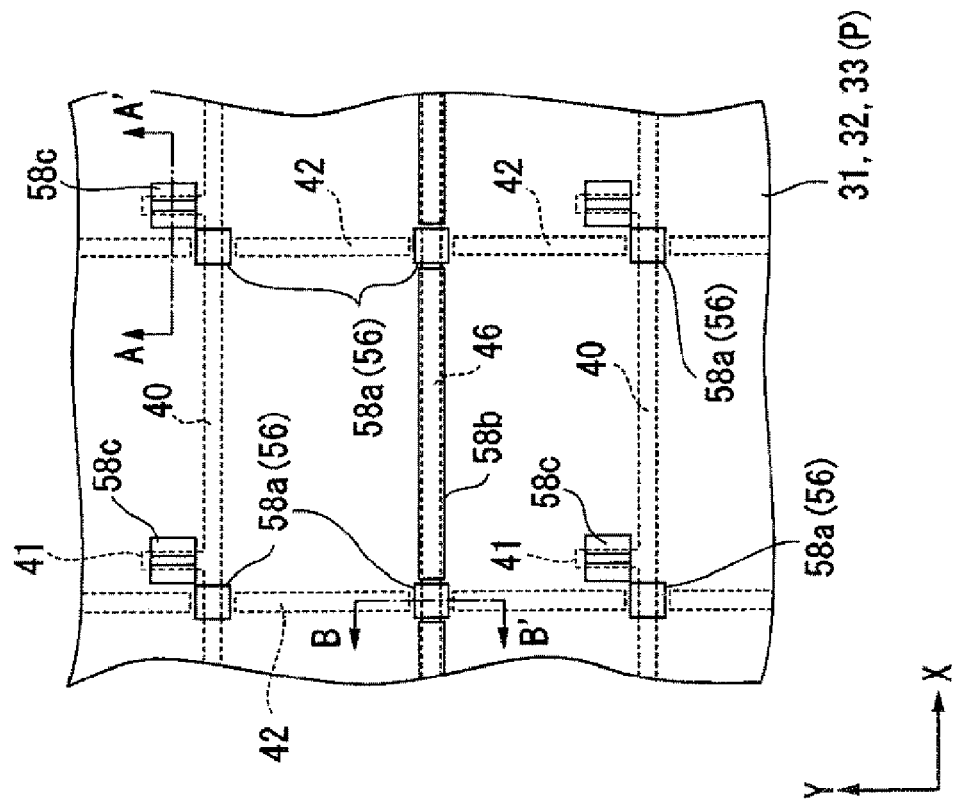

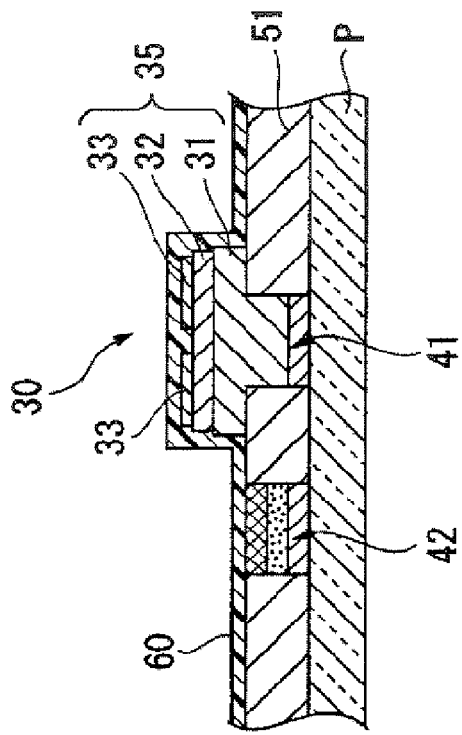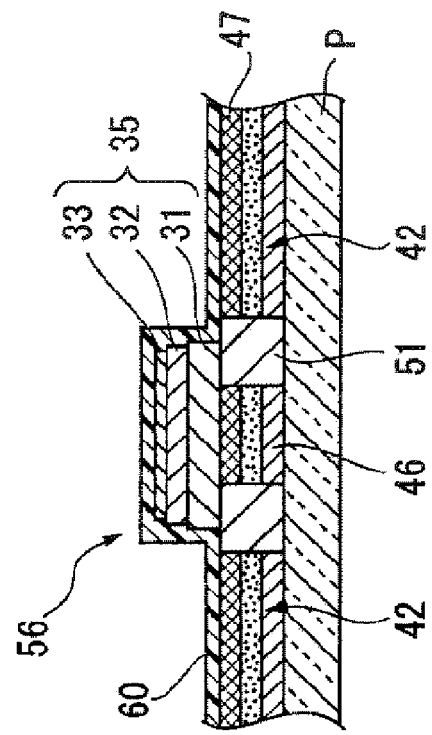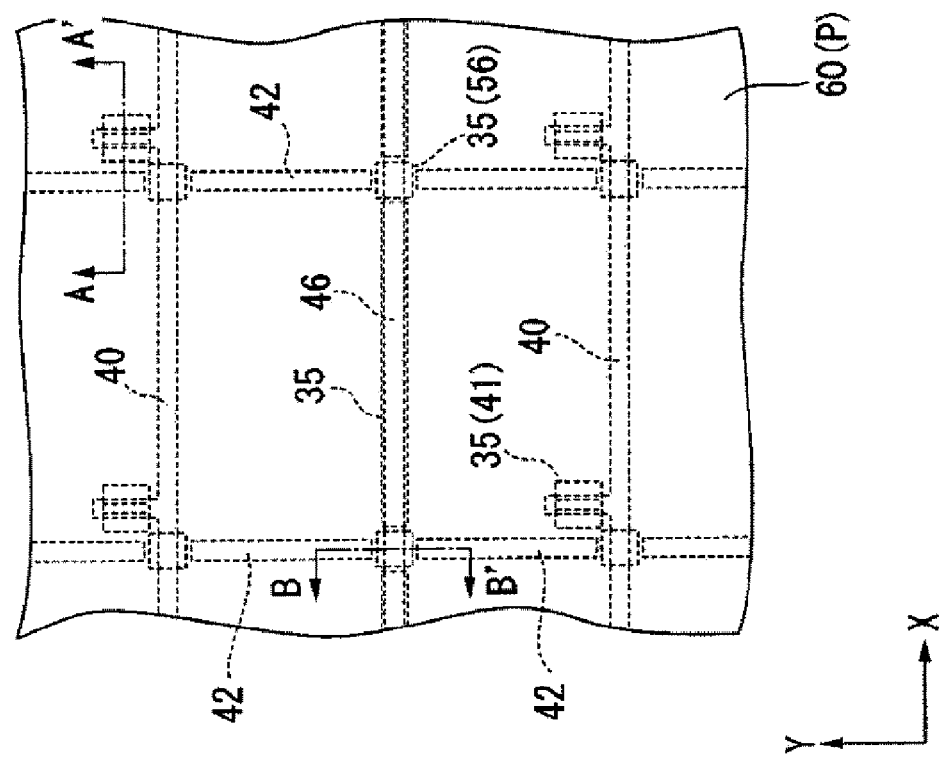

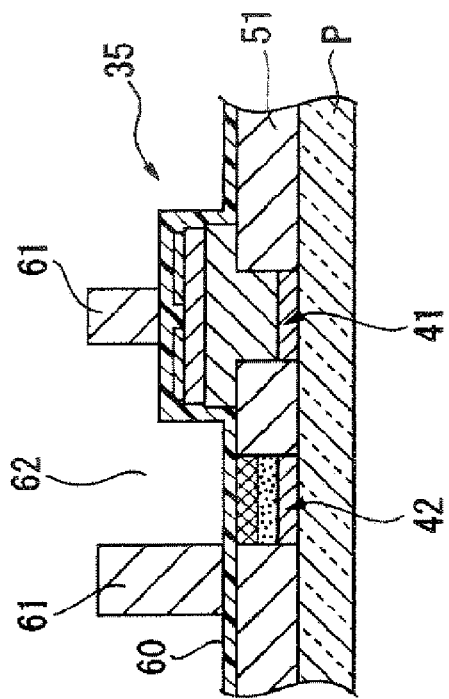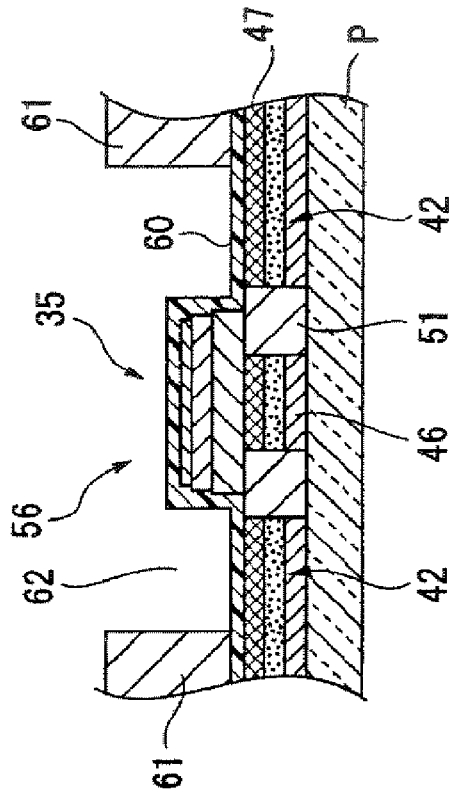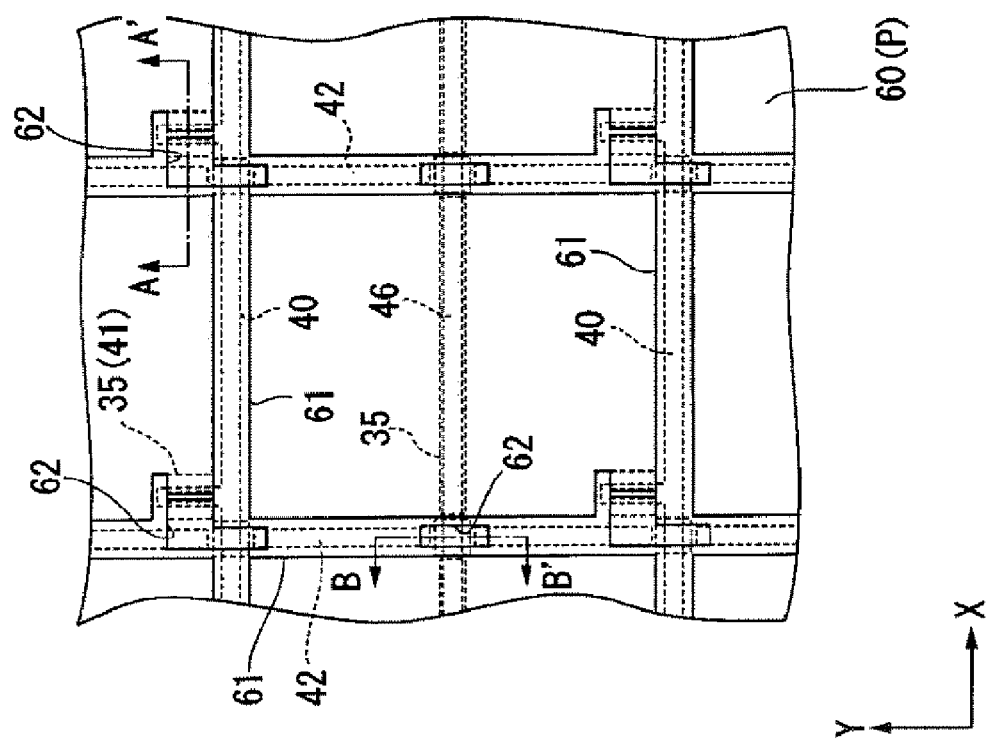

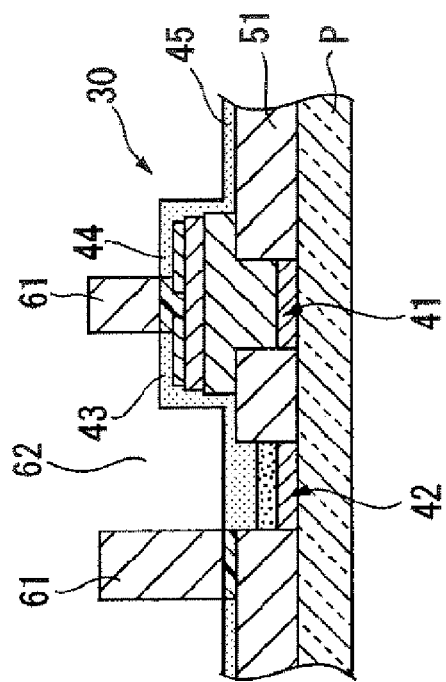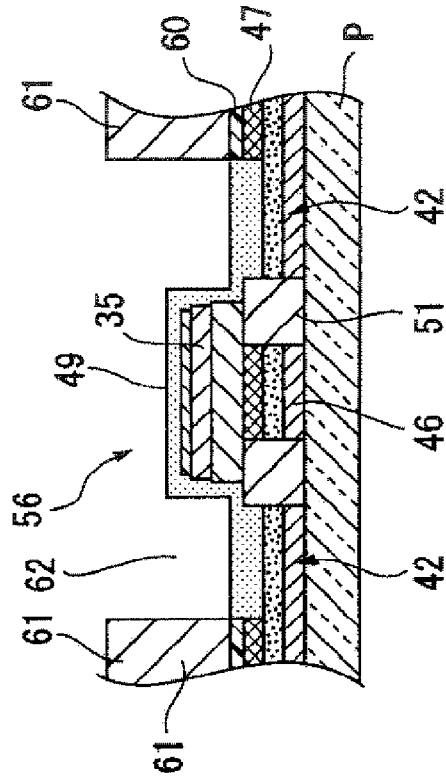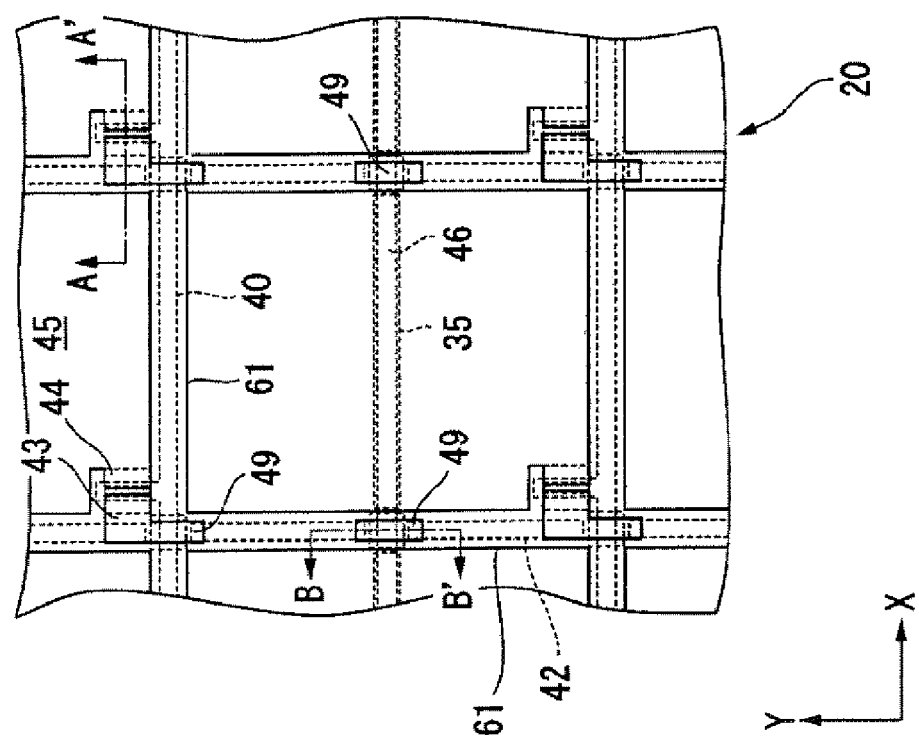

ACTIVE MATRIX SUBSTRATE, MANUFACTURING METHOD THEREOF, ELECTRO-OPTICAL DEVICE, AND ELECTRONIC APPARATUS

BACKGROUND

1. Technical Field

The present invention relates to an active matrix substrate, a method for manufacturing it, an electro-optical device, and an electronic apparatus.

2. Related Art

Along with the popularization of mobile apparatuses such as notebook personal computers and cellular phones, thin-and-light liquid display devices are widely used. A liquid crystal display has a structure in which a liquid crystal layer is sandwiched between an upper substrate and a lower substrate.

An example of the lower substrate (active matrix substrate) is shown in FIG. 21. As shown in FIG. 21, a lower substrate 1 is provided with a glass substrate 2, a gate scanning electrode 3 and a source electrode 4 both of which are wired so as to intersect each other on the glass substrate 2, a drain electrode 5 wired on the glass substrate 2, a pixel electrode 6 (ITO) connected to the drain electrode 5, an insulation layer 7 interposed between the gate scanning electrode 3 and the source electrode 4, and a thin film transistor (TFT) 8 made of a thin film semiconductor.

For forming metal wiring lines in the lower substrate 1, a method is used as exemplified in Japanese Patent No. 3261699. In the method, a process combining dry processing and photolithographic etching is repeated several times.

The method, however, has a problem in that material costs and administrative costs increase, while a yield rate is hardly increased since the process combining dry processing and photolithographic etching is carried out several times.

Thus, in recent years, a use of liquid discharge methods has been increased as a coating method used in manufacturing processes of electronic apparatuses. In a coating technique by means of liquid discharge methods, generally, liquids are discharged as droplets from a plurality of nozzles provided to a liquid discharge head while a substrate and the liquid discharge head are relatively moved so that the droplets are repeatedly deposited on the substrate to form a coated film. Therefore, this method consumes liquid with less waste and any patterns can directly be coated without using means such as photolithography.

For example, a technique is disclosed in JP-A-11-274671 and JP-A-2000-216330, in which a fine wiring pattern such as for a semiconductor integrated circuit is formed by discharging a functional liquid containing a pattern forming material onto a substrate from a liquid drop discharge head so as to provide or coat the material onto a pattern forming surface.

In addition, a method is disclosed in JP-A-2005-012181 in which, when a gate electrode having a width narrower than a gate wiring line is formed, a droplet containing a conductive material is coated to a gate wiring line groove. Liquids formed by the droplet autonomously flow in the gate electrode groove by a capillary phenomenon, thereby being disposed in the groove.

However, the above-mentioned related art technique has the following setbacks.

Characteristics of a TFT element formed on a gate electrode depend on flatness of amorphous silicon. The flatness of amorphous silicon is influenced by flatness of the gate electrode.

Therefore, particularly when a gate electrode is formed by the above-mentioned droplet discharge method, a problem arises in that flatness is lowered due to a rough surface caused by large-size grains of fine particles that are fusion bonded by a heat in firing when a droplet containing silver fine particles is used, for example.

SUMMARY

An advantage of the invention is to provide an active matrix substrate in which a pattern having high flatness can be formed, a manufacturing method thereof, and an electro-optical device and an electronic apparatus that include the active matrix substrate.

Aspects of the invention will be described below.

A method for manufacturing an active matrix substrate according to a first aspect of the invention includes forming a first conductive layer across a first wiring line forming area and a second wiring line forming area on a substrate including a first wiring line and a second wiring line having a width narrower than a width of the first wiring line, and forming a second conductive layer on the first conductive layer formed in the first wiring line forming area in a layered state, and on the first conductive layer formed in the second wiring line forming area in a non-layered state.

In the method, the first conductive layer is formed by a material such as nickel different from a material that lowers its flatness when it is heated such as gold and silver, while the second conductive layer is formed by a material such as silver. This makes it possible to improve flatness of the second wiring line and to secure low electrical resistance in the first wiring line.

In the method, a process to form a switching element on at least a part of the second wiring line can preferably be employed.

The characteristics of the switching element, which is formed on the second wiring line improved in flatness, can be advanced.

The first conductive layer is preferably formed by discharging a first droplet containing a first conductive material while the second conductive layer is preferably formed by discharging a second droplet containing a second conductive material.

The method enables any pattern to be directly coated with less wastage in liquids consumption without using a method such as photolithography.

The first conductive layer in the second wiring line forming area is preferably formed by flowing the first droplet discharged to the first wiring line forming area to the second wiring line forming area. Accordingly, a droplet can be coated to the second wiring line forming area having a width narrower than the flying diameter of the second droplet, thereby enabling a fine pattern to be formed.

In the method, the first droplet can preferably contain an organic solvent while the second droplet can preferably contain an aquatic solvent.

The first droplet landed on the first wiring line forming area can easily flow to the second wiring line forming area having a narrow width, while the second droplet landed on the first wiring line forming area can be suppressed to flow to the second wiring line forming area.

The method preferably further includes: forming a wiring pattern of a grid of wiring lines, the wiring pattern including the first wiring line, and the second wiring line and one of the wiring lines intersected at an intersection part being separated; forming a multilayered part composed of an insulation film and a semiconductor film on the intersection part and on a part of the wiring pattern; and forming a connection layer on the multilayered part and a pixel electrode, the connection layer electrically coupling separated parts of the one of the wiring lines, and the pixel electrode being electrically coupled to the wiring pattern through the semiconductor film.

The one of the wiring lines separated at the intersection part can be electrically connected by the connection layer formed via the insulation film. The one is included in the wiring lines, which intersect on the same plane and form the wiring pattern of a grid. Also, the number of processes combining dry processing and photolithographic etching can be reduced, thereby enabling manufacturing costs to be reduced and a yield to be increased.

The switching element can preferably be formed by performing a half-exposure treatment to the semiconductor film.

The switching element can easily be formed.

In the method, the wiring pattern can include a source wiring line, a gate wiring line having a gate electrode, and a capacitance line extending in approximately a straight line along the gate wiring line, the source wiring line can be separated at the intersection part, and the first wiring line can include the gate wiring line while the second wiring line can include the gate electrode.

The above-described structure avoids the wiring lines from being touched each other. As a result, the wiring lines can be formed simultaneously on the same plane.

An active matrix substrate according to a second aspect of the invention is manufactured by the method for manufacturing an active matrix substrate.

An active matrix substrate can be provided that has a wiring pattern excellent in flatness and a switching element improved in characteristics.

An electro-optical device according to a third aspect of the invention is provided with the active matrix substrate.

An electronic apparatus according to a fourth aspect of the invention is provided with the active matrix substrate.

High quality electro-optical device and electronic apparatus that have a switching element improved in characteristics can be provided.

BRIEF DESCRIPTION OF THE DRAWINGS

The invention will be described with reference to the accompanying drawings, wherein like numbers reference like elements.

FIGS. 6A and 6B illustrate a process following FIGS. 5A and 5B.

FIGS. 11A and 11B illustrate a process following FIGS. 6A and 6B.

FIGS. 12A, 12B and 12C illustrate a process following FIGS. 11A and 11B.

FIGS. 14A, 14B and 14C illustrate a process following FIGS. 13A, 13B, and 13C.

FIGS. 15A, 15B and 15C illustrate a process following FIGS. 14A, 14B and 14C.

FIGS. 17A, 17B and 17C illustrate a process following FIGS. 16A, 16B and 16C.

DESCRIPTION OF EXEMPLARY EMBODIMENTS

Embodiments of the invention, which relate to an active matrix substrate, a manufacturing method thereof, an electro-optical device, and an electronic apparatus, will be described below with reference to FIGS. 1A through 20C.

Active Matrix Substrate

Figure 1:
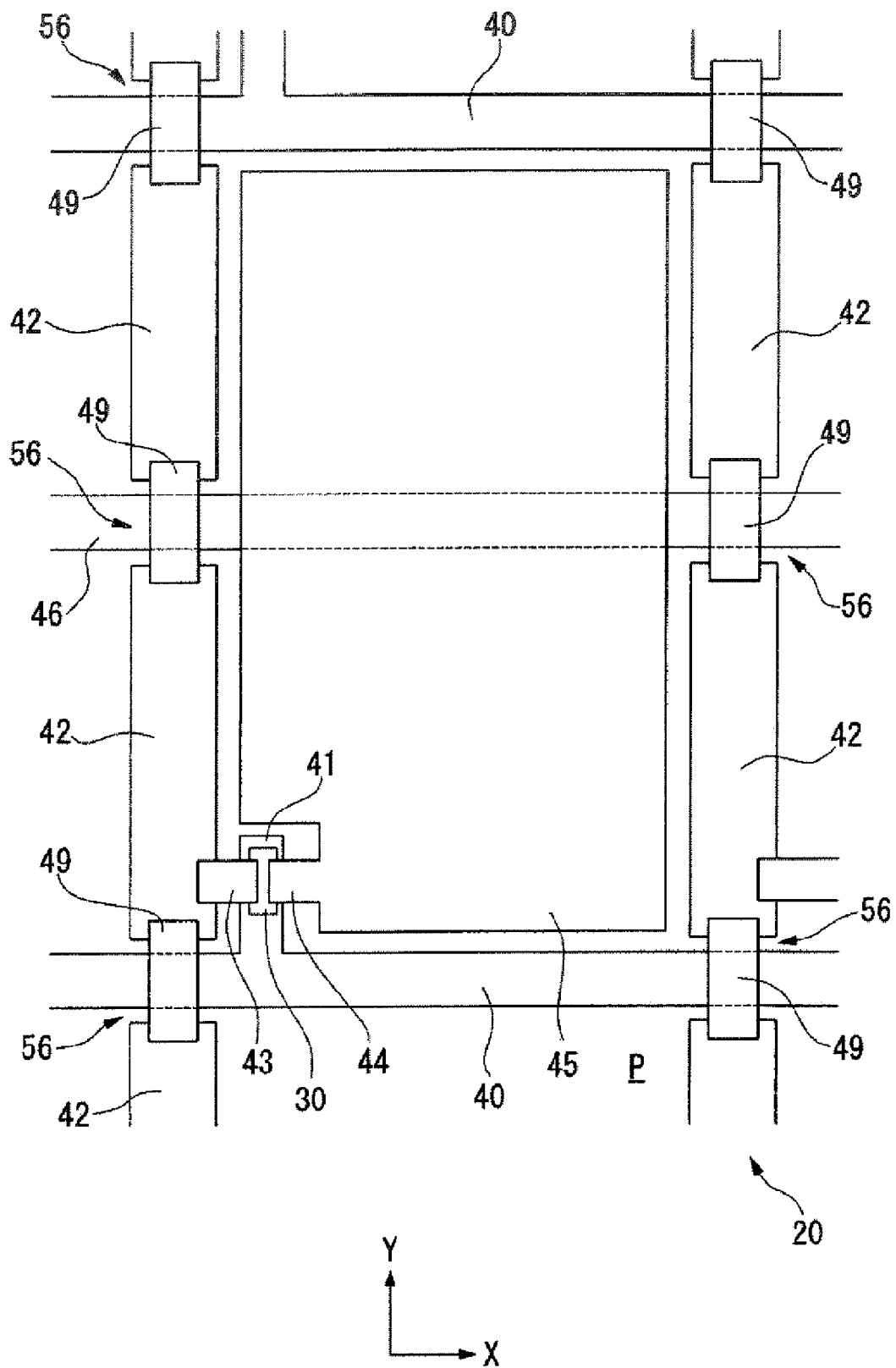
FIG. 1 is a partially enlarged view of an active matrix substrate.

FIG. 1 is a schematic view enlarging a part of an active matrix substrate according to the invention.

On an active matrix substrate 20, gate wiring lines 40 (a first wiring line) and source wiring lines 42 are provided by wiring them in a grid. Namely, a plurality of gate wiring lines 40 is formed so as to extend in the X-direction, while a plurality of source wiring lines 42 is formed so as to extend in the Y-direction.

Each of the gate wiring lines 40 connects a gate electrode 42 (a second wiring line), which has a narrower width than the gate wiring line 40, as a part of the gate wiring line 40. On the gate electrode 41, a TFT 30 (switching element) is disposed with an insulation layer interposed therebetween. In contrast, each of the source wiring lines 42 connects a source electrode 43, one end of which connects the TFT 30.

In an area surrounded by the gate wiring line 40 and the source wiring line 42, a pixel electrode 45 is disposed, which connects the TFT 30 through a drain electrode 44.

Wired on the active matrix substrate 20 is a capacitance line 46 so as to be nearly in parallel with the gate wiring line 40. The capacitance wiring line 46 is disposed under the pixel electrode 45 and the source line 42 via an insulation layer.

The gate wiring line 40, the gate electrode 41, the source wiring line 42, and capacitance line 46, which are included in a wiring pattern according to the invention, are formed on the same plane.

Figure 2:
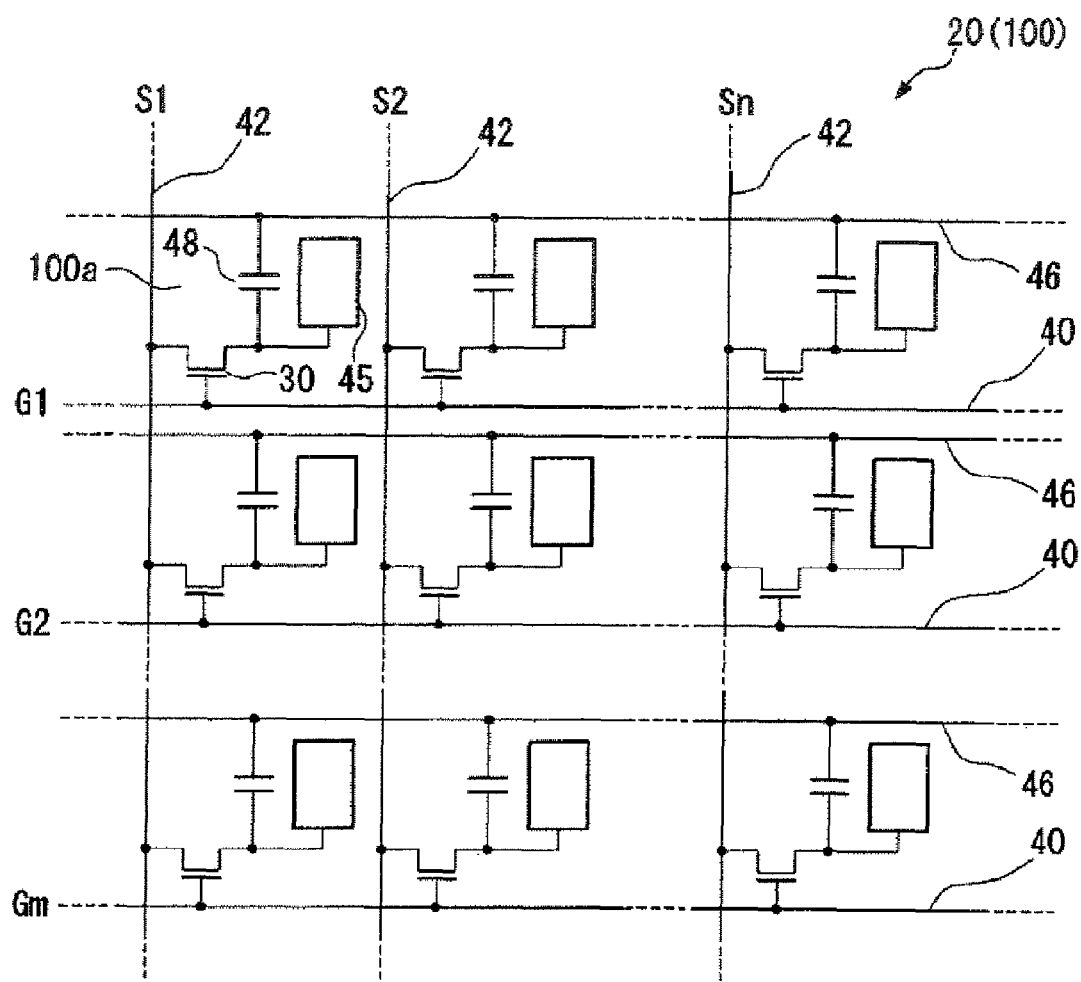
FIG. 2 is an equivalent circuit diagram of the active matrix substrate.

FIG. 2 is an equivalent circuit diagram of the active matrix substrate 20, which is used for a liquid crystal display.

When the active matrix substrate 20 is used for a liquid crystal display, a plurality of pixels 100a is formed in a matrix in an image display area. Each of the pixels 100a includes the TFT 30 for switching a pixel. Each source wiring line 42 supplying respective pixel signals S1, S2, . . . , Sn is electrically connected to a source of each TFT 30 through the source electrode 43 shown in FIG. 1. The pixel signals S1, S2, . . . , Sn supplied to the source wiring lines 42 may be supplied line-sequentially in this order or for every group of the source wiring lines 42 adjacent to each other.

Electrically connected to a gate of the TFT 30 is the gate wiring line 40 through the gate electrode 41 shown in FIG. 1.

Scanning signals G1, G2, ..., Gm are supplied pulsatively and line-sequentially to the gate wiring lines 40 in this order at a predetermined timing.

The pixel electrode 45 is electrically connected to a drain of the TFT 30 through the drain electrode 44. The TFT 30, which is a switching element, is turned on for a certain period, thereby the pixel signals S1, ..., Sn supplied from the source wiring lines 42 are respectively written in each pixel at a predetermined timing. The pixel signals S1, ..., Sn, each of which has a predetermined level and written in liquid crystal through the pixel electrode 45, are retained between a counter electrode 121 of a counter substrate 120 shown in FIG. 19 and the pixel electrode 45 for a certain period.

In order to prevent a leak of the pixel signals S1, ..., Sn retained, a storage capacitor 48 is provided by the capacitance line 46 in parallel with a liquid crystal capacitance formed between the pixel electrode 45 and the counter electrode 121. For example, the voltage of the pixel electrode 45 is retained by the storage capacitor 48 for a period of time three orders of magnitude longer than the time during which a source electrode is applied. Consequently, an electron retention property increases, thereby a liquid crystal display 100 with a high contrast ratio can be provided.

Droplet Discharge Device

A droplet discharge device used for manufacturing the active matrix substrate 20 will be described with reference to FIGS. 3 and 4.

Figure 3:
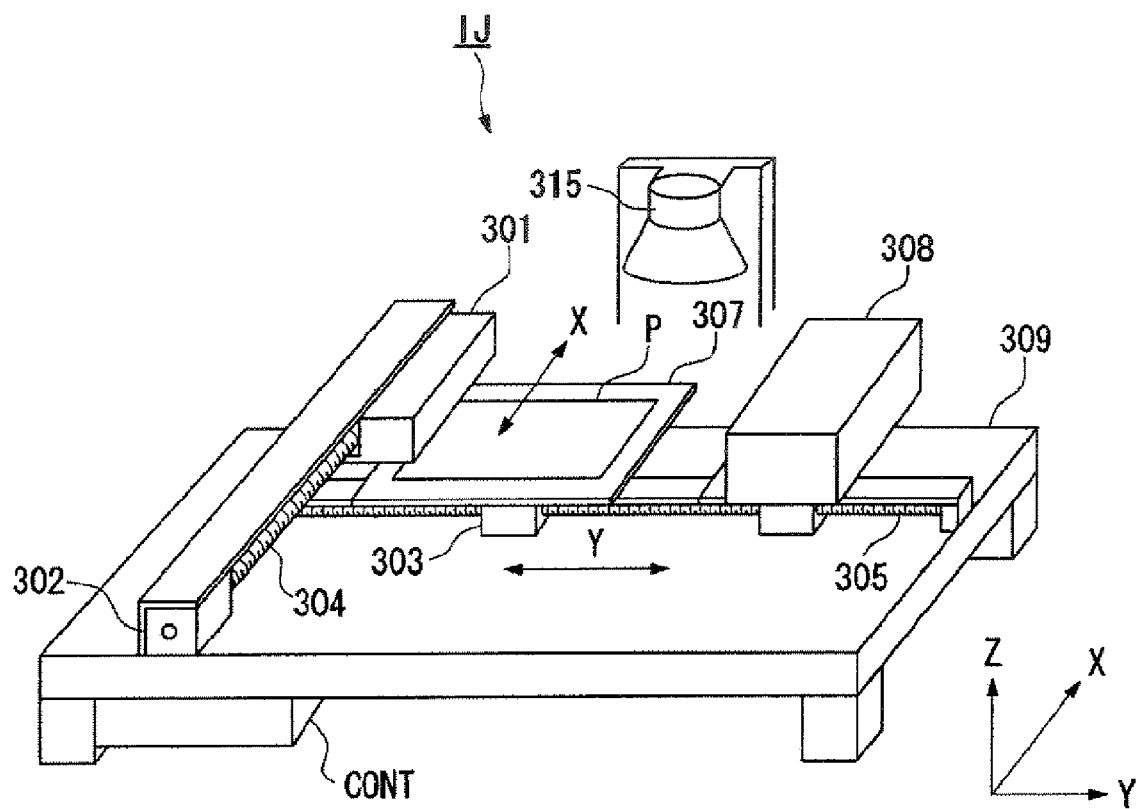
FIG. 3 is a schematic perspective view of a droplet discharge device.

As shown in FIG. 3, a droplet discharge device (inkjet device) IJ, which discharges (drops) a droplet to a substrate P from a droplet discharge head, is provided with a droplet discharge head 301, an X-direction drive axis 304, a Y-direction guide axis 305, a controller CONT, a stage 307, a cleaning mechanism 308, a base 309, and a heater 315. The stage 307, which supports the substrate P to which ink (a liquid material or liquids) is disposed by the droplet discharge device IJ, includes a fixing mechanism (not shown) for fixing the substrate P to a reference position.

The droplet discharge head 301 is a multi-nozzle type droplet discharge head including a plurality of discharge nozzles. The longitudinal direction of the head 301 coincides with the X-axis direction. The plurality of discharge nozzles is disposed on a lower surface of the droplet discharge head 301 in the X-axis direction by a constant interval. The ink containing conductive fine particles is discharged from the discharge nozzles included in the droplet discharge head 301 to the substrate P supported by the stage 307.

An X-direction drive motor 302 is connected to the X-direction drive axis 304. The X-direction drive motor 302 is a stepping motor, for example, and rotates the X-direction drive axis 304 when the controller CONT supplies the motor 302 with a driving signal for the X-direction. The X-direction drive axis 304 rotates so as to move the droplet discharge head 301 in the X-axis direction.

The Y-direction guide axis 305 is fixed so as not to move with respect to the base 309. The stage 307 is provided with a Y-direction drive motor 303. The Y-direction drive motor 303 is a stepping motor, for example, and moves the stage 307 in the Y-direction when the controller CONT supplies the motor 303 with a driving signal for the Y-direction.

The controller CONT supplies the droplet discharge head 301 with a voltage for controlling a droplet discharge. The controller CONT also supplies the X-direction drive motor 302 with a drive pulse signal for controlling the movement of the droplet discharge head 301 in the X-direction, and the Y-direction drive motor 303 with a drive pulse signal for controlling the movement of the stage 307 in the Y-direction.

The cleaning mechanism 308 cleans the droplet discharge head 301. The cleaning mechanism 308 is provided with a Y-direction drive motor (not shown). By driving the Y-direction drive motor, the cleaning mechanism is moved along the Y-direction guide axis 305. The controller CONT also controls the movement of the cleaning mechanism 308.

The heater 315, which is means to subject the substrate P under a heat treatment by a lump annealing in this case, evaporates and dries solvents contained in a liquid material coated on the substrate P. The controller CONT also controls turning on and off of the heater 315.

The droplet discharge device IJ discharges droplets to the substrate P while relatively scanning the droplet discharge head 301 and the stage 307 supporting the substrate P. In the following description, the Y-direction is referred to as a scan direction and the X-direction perpendicular to the Y-direction is referred to as a non-scan direction.

Therefore, the discharge nozzles of the droplet discharge head 301 are disposed at a fixed interval in the X-direction, which is the non-scan direction. While the droplet discharge head 301 is disposed at right angle to the moving direction of the substrate P in FIG. 3, the angle of the droplet discharge head 301 may be adjusted so as to intersect the moving direction of the substrate P. Accordingly, a pitch between the nozzles can be adjusted by adjusting the angle of the droplet discharge head 301. In addition, the distance between the substrate P and a nozzle surface may be arbitrarily adjusted.

Figure 4:
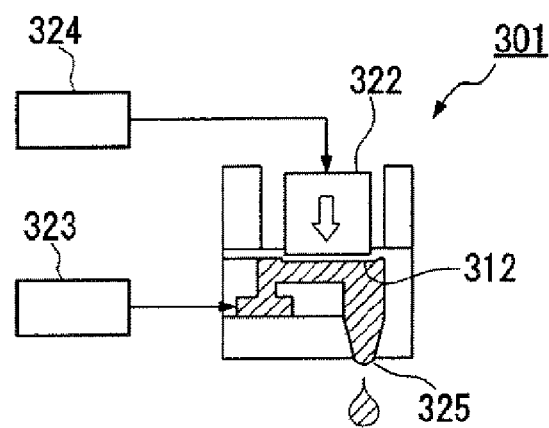
FIG. 4 is a cross-sectional view of a droplet discharge head.

FIG. 4 is a sectional-view of the droplet discharge head 301.

In the droplet discharge head 301, a piezo element 322 is disposed adjacent to a liquid chamber 321 storing a liquid material (ink such as for wiring lines). To the liquid chamber 321, a liquid material is supplied through a liquid material supply system 323 including a material tank that stores the liquid material.

The piezo element 322 is connected to a driving circuit 324. A voltage is applied to the piezo element 322 through the driving circuit 324 so as to deform the piezo element 322, thereby the liquid chamber 321 is deformed to discharge the liquid material from a nozzle 325.

In this case, a strain amount of the piezo element 322 is controlled by changing a value of applied voltage. In addition, a strain velocity of the piezo element 322 is controlled by changing a frequency of applied voltage. The droplet discharge employing this piezoelectric method advantageously has less effect on a material composition since no heat is applied to the material.

As the discharging techniques of droplet discharging methods, a charge control method, a pressurized vibration method, an electromechanical converting method, an electrothermal converting method, and an electrostatic attraction method are exemplified. In the charge control method, an electric charge is applied to a material by a charge electrode. The material is discharged from a discharge nozzle by controlling a flying direction of the material with a deflecting electrode. In the pressurized vibration method, for example, ultra-high pressure of approximately 30 kg/cm$^2$ is applied to a material so as to discharge a material at the tip of a nozzle. If no control voltage is applied, the material moves straight ahead so as to be discharged from a discharge nozzle. If a control voltage is applied, electrostatic repelling occurs in the materials so as to disperse the material, whereby no material is discharged from the nozzle. Also, in the electromechanical converting method, characteristics of a piezo element (piezoelectric element) is utilized that it is deformed in response to a pulsed electric signal, and the deformation of the piezo element applies pressure, via an elastic material, to a space storing a material to push the material out of the space so as to discharge it from a discharge nozzle.

In the electrothermal conversion method, a material is rapidly evaporated with a heater provided in a space storing the material so as to produce bubbles, thereby the material in the space is discharged by means of pressure of the bubbles. In the electrostatic attraction method, micro pressure is applied to a space storing a material so as to form a meniscus of the material at a discharge nozzle. Electrostatic attraction is then applied so as to pull out the material. Other than the methods, a method that uses a fluid viscosity change caused by an electric field, and a method that uses electric discharge sparks can also be employed. The droplet discharge methods have the advantage of adequately disposing a material in a desired amount at a desired location with little waste in the use of the material. An amount of one liquid material (fluid) droplet discharged by the droplet discharge methods is, for example, from 1 to 300 nanograms.

Here, examples of a conductive fine particle contained in a solution discharged as a droplet include: a metal fine particle of gold, silver, copper, tin, lead, or the like, and their oxides; and a fine particle of a conductive polymer or a superconducting material. These conductive fine particles may be used by coating their surfaces with an organic matter or the like to improve their dispersibility.

The diameter of the conductive fine particle is preferably in the range from 1 nm to 0.1 μm. Particles having a diameter larger than 0.1 μm may cause clogging of a discharge nozzle included in a droplet discharge head, which will be described later, while particles having a diameter smaller than 1 nm may make the volume ratio of a coated material to the particles so large that the ratio of an organic matter in the resulting film becomes excessive.

Here, any dispersion medium can be used as long as it is capable of dispersing the above-described conductive fine particles and does not cause an aggregation. Examples of the medium can include: water; alcohols such as methanol, ethanol, propanol, and butanol; hydro-carbon compounds such as n-heptane, n-octane, decane, dodecane, tetradecane, toluene, xylene, cymene, durene, indene, dipentene, tetrahydronaphthalene, decahydronaphthalene, and cyclohexylbenzene; ether compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl) ether, and p-dioxane; and polar compounds such as propylene carbonate, gamma-butyrolactone, N-methyl-2-pyrrolidone, dimethylformamide, dimethyl sulfoxide, and cyclohexanone. Water, the alcohols, the carbon hydride series compounds, and the ether series compounds are preferable for the dispersion medium, water and the carbon hydride series compounds are much preferred from the following points of view: a dispersion of the fine particles, stability of a dispersion liquid, and an ease of the application for the droplet discharging method (inkjet method).

The surface tension of a dispersion liquid of conductive fine particles is preferably, for example, in the range from 0.02 N/m to 0.07 N/m. If the surface tension is below 0.02 N/m when the liquid is discharged by using an inkjet method, the wettability of an ink composition with respect to a nozzle surface is increased, rendering it likely to cause a flight curve, while if the surface tension exceeds 0.07 N/m, a meniscus shape at the tip of the nozzle is unstable, rendering controlling the discharge amount and discharge timing problematic To adjust the surface tension, a fluorine-, silicone- or nonionic-based surface tension adjuster, for example, may be added in a small amount to the dispersion liquid in a range not largely lowering a contact angle with respect to a substrate. The nonionic surface tension adjuster enhances the wettability of a liquid with respect to a substrate, improves the leveling property of a film, and serves to prevent minute concavities and convexity of the film from being generated. The surface tension adjuster may include, as necessary, organic compounds, such as alcohol, ether, ester, and ketone.

The viscosity of a dispersion liquid is preferably in the range from 1 mPa·s to 50 mPa·s. When a liquid material is discharged as a droplet by using an inkjet method, ink having a viscosity lower than 1 mPa·s may contaminate the periphery of a nozzle due to ink leakage. Ink having a viscosity higher than 50 mPa·s may possibly cause a nozzle clogging, making it difficult to discharge droplets smoothly.

A method for manufacturing an active matrix substrate

A method for manufacturing the active matrix substrate 20 will be described with reference to the accompany drawings.

The active matrix substrate 20 is manufactured by the following three processes: a first process to form wiring lines of a grid pattern on the substrate P, a second process to form a multilayered part 35, and a third process to form the pixel electrode 45 and the like.

Hereinafter, each of these processes is described in detail.

The first process to form wiring lines

Figure 5B:
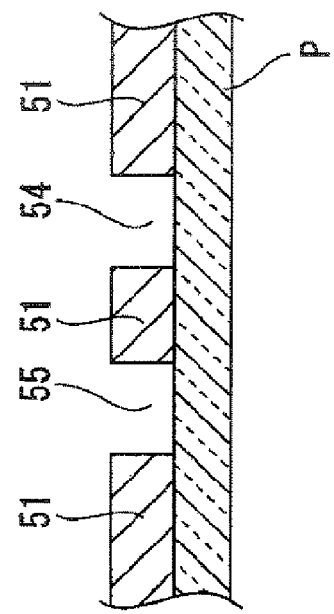
FIGS. 5A and 5B illustrate a procedure to manufacture the active matrix substrate.

FIGS. 5A, 5B, 6A and 6B illustrate a wiring line forming process, which is the first process. FIGS. 5B and 6B are sectional-views taken along the line A-A' in FIGS. 5A and 6A respectively.

Examples of materials for the substrate P, on which wiring lines of a grid pattern such as the gate wiring lines 40 and the source wiring lines 42 are formed, include glass, silica glass, a silicon wafer, a plastic film, and a metal plate. Such examples may also include the above-described material substrates whose surfaces are provided with a base layer such as a semiconductor film, metal film, dielectric film, or an organic film.

Figure 5A:
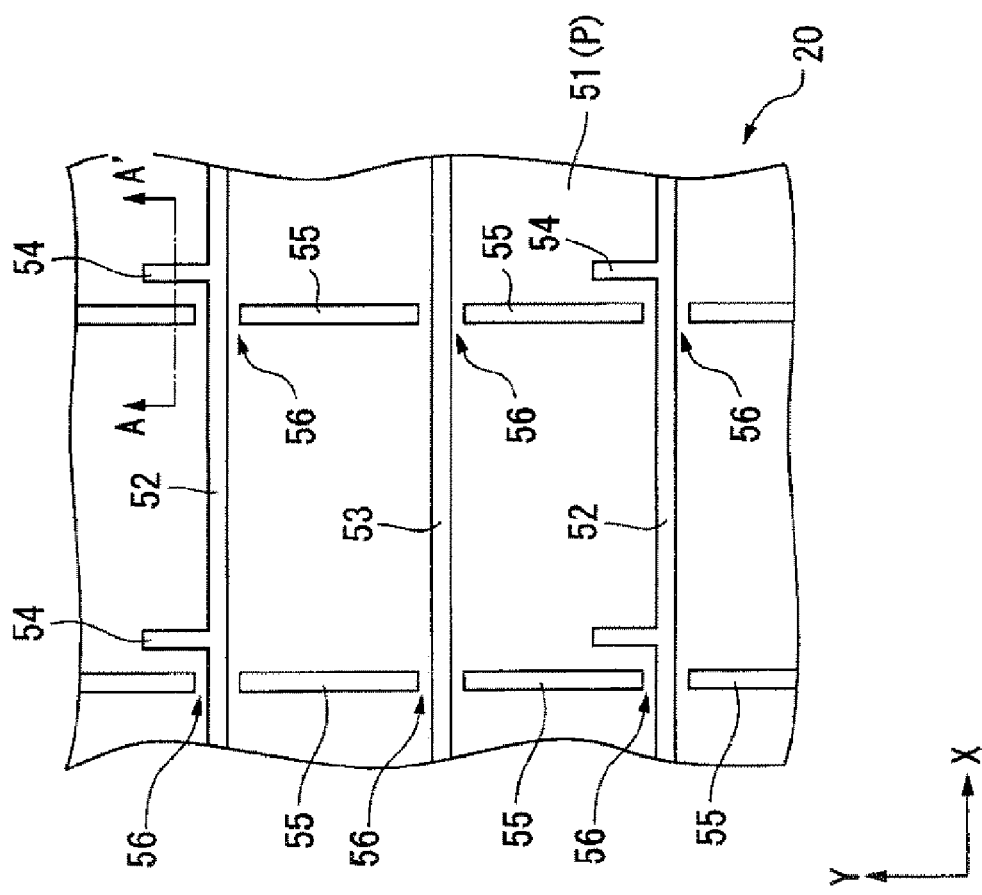

First, a bank 51 made of an insulative organic resin is formed on the substrate P as shown in FIGS. 5A and 5B. The bank functions to dispose a wiring ink described later to a predetermined position of the substrate P.

Specifically, as shown in FIG. 5A, the bank 51 having a plurality of openings 52, 53, 54, and 55 is formed on the upper surface of the substrate P, which has been cleaned, by photolithography. The plurality of openings 52, 53, 54, and 55 corresponds to forming positions of wiring lines of a grid pattern.

Examples of materials for the bank 51 include polymer materials such as an acrylic resin, a polyimide resin, an olefin resin, and a melamine resin.

Next, a residue treatment process is performed to the substrate P in order to remove a resist (organic material) residue between banks. The residue is produced when the bank is formed.

As the residue treatment, an ultraviolet rays (UV) irradiation treatment performing the residue treatment by an irradiation of ultraviolet rays, an $O_2$ plasma treatment using oxygen as a treatment gas in the air atmosphere, or the like can be selected. In this case, the $O_2$ plasma treatment is carried out.

Specifically, the substrate P is irradiated with oxygen in plasma state from a plasma discharge electrode. As conditions of the $O_2$ plasma treatment, for example, a plasma power is from 50 to 1000 W, an oxygen gas flow volume is from 50 to 100 ml/min, a substrate transportation velocity of the substrate P with respect to a plasma discharge electrode is from 0.5 to 10 mm/sec, and a substrate temperature is from 70 to 90 degrees centigrade.

When the substrate P is a glass substrate, its surface has lyophilicity to a wiring pattern forming material. Additionally, the lyophilicity of the surface of a substrate can be more increased by performing the $O_2$ plasma treatment or ultraviolet rays irradiation treatment for the residue treatment, as shown in the embodiment.

Then, a lyophobic treatment is performed to the bank 51 in order to favorably dispose a wiring pattern ink into the openings 52, 53, 54, and 55. As the lyophobic treatment, a $CF_4$ plasma treatment or the like (plasma treatment using gas containing a fluorine component) is carried out.

By performing such lyophobic treatment, a fluorine group is introduced into a resin that forms the bank 51, thereby providing high lyophobicity to the bank 51. The $O_2$ plasma treatment as a lyophilic treatment is preferably performed after the bank 51 is formed rather before the bank 51 is formed, since the bank 51 has the characteristic of easily being fluorinated (given lyophobicity) when the $O_2$ plasma treatment is performed as a pretreatment before the lyophobic treatment is carried out.

The lyophobic treatment on the bank 51 somewhat affects on the surface of the substrate P on which the lyophilic treatment has been performed. However, when the substrate P is particularly made of glass or the like, the substrate P practically does not lose its lyophilicity, i.e. wettablity, since the fluorine group is hardly introduced to the substrate P by the lyophobic treatment.

If the bank 51 is formed by a material having lyophobicity (e.g. a resin material having a fluorine group), the lyophobic treatment may be omitted.

The openings 52, 53, 54, and 55 that are formed by the bank 51 correspond to wiring lines of a grid pattern such as the gate wiring lines 40 and the source wiring lines 42. Namely, the wiring lines of a grid pattern such as the gate wiring lines 40 and the source wiring lines 42 are formed by disposing a wiring line metal material to the openings 52, 53, 54, and 55.

Specifically, the openings 52 and 53, which are formed so as to extend in the X-direction, correspond to the positions to form the wiring line 40 and the capacitance line 46 respectively. In addition, the opening 52 corresponding to the position to form the gate wiring line 40 connects the opening 54 corresponding to the position to form the gate electrode 41. The opening 55, which is formed so as to extend in the Y-direction, corresponds to the position to form the source wiring line 42. Here, the opening 55 extending in the Y-direction is separated at an intersection part 56 so as not to intersect the openings 52 and 53 that extend in the X-direction.

The wiring lines of a grid pattern structured by such as the gate wiring lines 40 and the source wiring lines 42 are formed on the substrate P by discharging and disposing a wiring line ink containing conductive fine particles into the openings 52, 53, 54, and 55 with the droplet discharge device IJ.

The wiring line ink includes a dispersion liquid in which conductive fine particles, organic silver compounds, or nanoparticles of silver oxide are dispersed in a dispersion medium. Examples of a conductive fine particle include: a metal fine particle of gold, silver, copper, tin, lead, or the like, and their oxides; and a fine particle of a conductive polymer or a superconducting material. These conductive fine particles may be used by coating their surfaces with an organic matter or the like to improve their dispersibility.

In this embodiment, the wiring pattern is formed by the following structure as shown in FIG. 6B: the gate wiring line 40, source wiring line 42, and capacitance line 46 form a three-layer structure, and the gate electrode 41 forms a single-layer structure. Note that only the source wiring line 42 is illustrated in FIG. 6B. Specifically, in the embodiment, the gate wiring line 40, source wiring line 42, and capacitance line 46 are formed by three layers of a nickel layer F1 (a first conductive layer), a silver layer F2, a nickel layer F3 from the lowest layer, while the gate electrode 41 is formed by one layer of the nickel layer F1.

The process of forming the gate wiring line 40 and the gate electrode 41 will be described with reference to FIGS. 7 through 10.

Figure 7A:
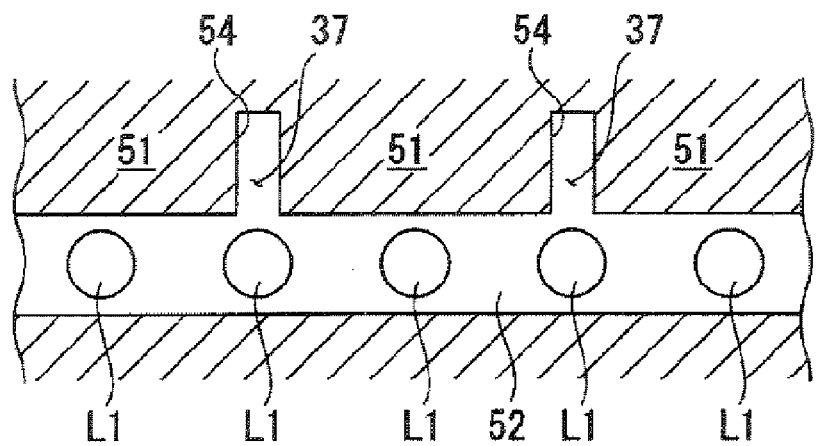
FIGS. 7A, 7B, and 7C illustrate a procedure to form a gate wiring line and a gate electrode.

In order to form the nickel layer F1 to the openings 52 and 54, a droplet of a functional liquid L1 (a first droplet) is disposed to a predetermined position of the opening 52 by the droplet discharge head 301 as shown in FIG. 7A. In the functional liquid L1, nickel (Ni) serving as a conductive fine particle is dispersed in an organic dispersion medium. When the droplet of the functional liquid L1 is disposed to the opening 52, the droplet is discharged to the opening 52 from above of the opening 52 by using the droplet discharge head 301. In the embodiment, the droplet of the functional liquid L1 is disposed along the longitudinal direction (the X-axis direction) at a predetermined interval as shown in FIG. 7A. In this case, the droplet of the functional liquid L1 is also disposed to the vicinity of a connection part 37 (an intersection area), where the opening 52 and the opening 54 are connected, in the opening 52.

Figure 7B:
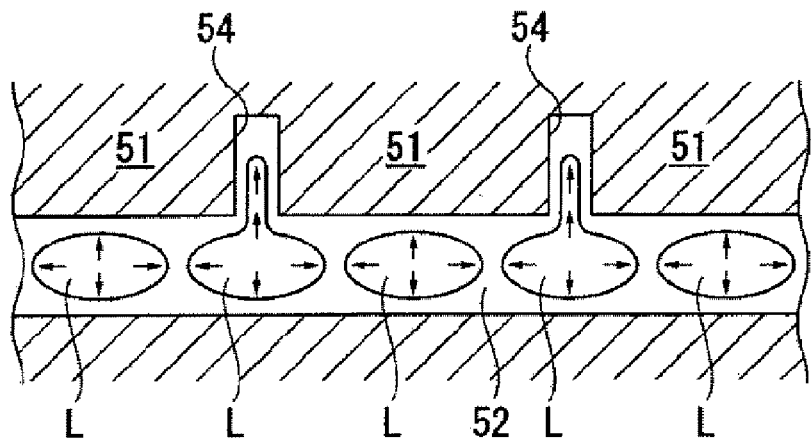

As shown in FIG. 7B, the functional liquid L1 disposed to the opening 52 wets and spreads in the opening 52 by an autonomous flow. In addition, the functional liquid L1 disposed to the opening 52 wets and spreads to the opening 54 by an autonomous flow caused by a capillary phenomenon and surface tension since the surface of the substrate P has lyophlicity. Accordingly, the functional liquid L1 can be disposed to the opening 54 without directly discharging the droplet to the opening 54.

Drying and firing treatments to remove the dispersion medium follow the discharge of the wiring line ink to the substrate P, if necessary. The drying and firing treatments secure the electrical contact between conductive fine particles, thereby the functional liquid L1 disposed turns to a conductive film.

The drying treatment may be carried out by a heating treatment using a typical hot plate, an electric furnace, or the like to heat the substrate P, for example. For example, the treatment is carried out at 180 degrees centigrade for about 60 minutes.

The processing temperature for the firing treatment is determined at an appropriate level, taking into account the boiling point (vapor pressure) of a dispersion medium, dispersibility of fine particles, thermal behavioral properties such as oxidizability of fine particles, the presence and volume of a coating material, and the heat resistance temperature of a base material, or the like. For example, eliminating a coating material made of an organic matter requires firing at about 250 degrees centigrade.

Figure 7C:
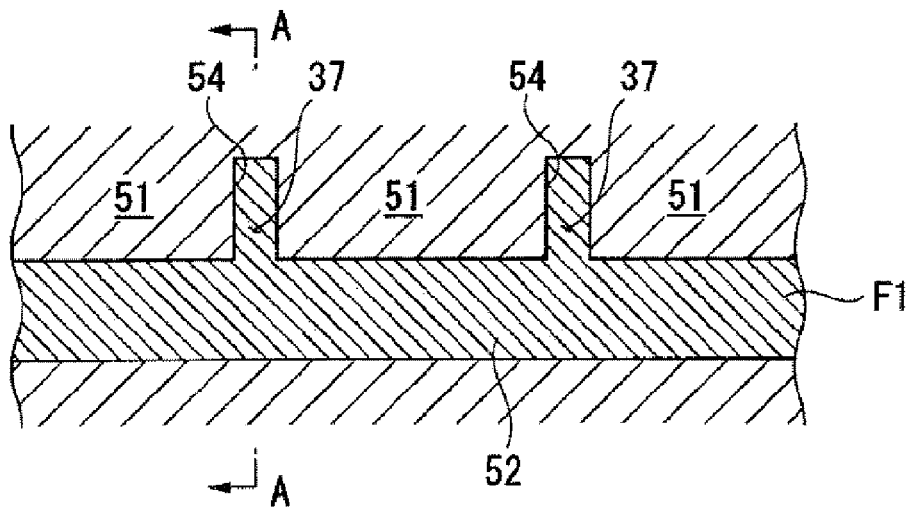
Figure 8A:
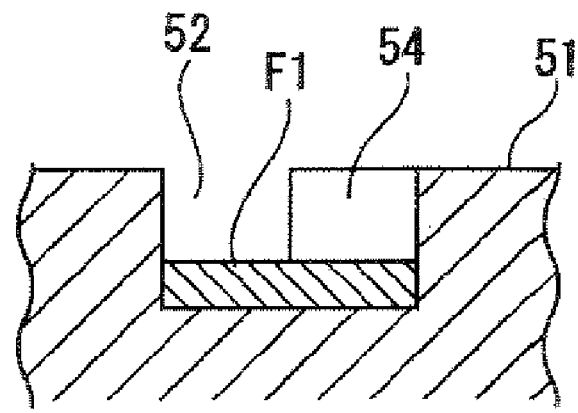
FIGS. 8A, 8B, and 8C illustrate the procedure to form the gate wiring line and the gate electrode.

As a result, the nickel layer F1 is formed across the opening 52 (a first wiring line forming area) and the opening 54 (a second wiring line forming area) as shown in FIG. 7C and FIG. 8A, which is a sectional-view taking along the line A-A of FIG. 7C.

Figure 9A:
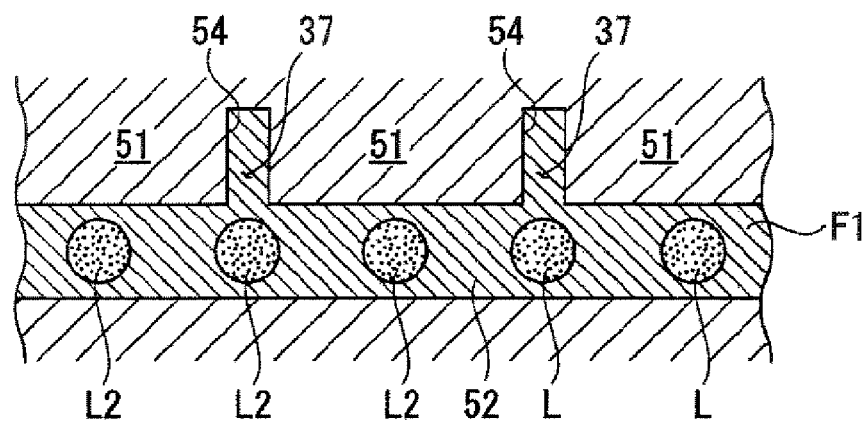
FIGS. 9A and 9B illustrate the procedure to form the gate wiring line and the gate electrode.

Then, in order to form the silver layer F2, a droplet of a functional liquid L2 (a second droplet) is disposed to a predetermined position (a position similar to that in forming the nickel layer F1) of the opening 52 with the droplet discharge head 301 as shown in FIG. 9A. In the functional liquid L2, silver (Ag) serving as a conductive fine particle is dispersed in an aquatic dispersion medium. The functional liquid L2 disposed to the opening 52 wets and spreads only in the opening 52 by an autonomous flow, but does not flow in the opening 54 since the functional liquid L2 contains the aquatic dispersion medium and the bank 51, which forms the opening 54 having a narrow width, has lyophobicity.

Figure 8B:
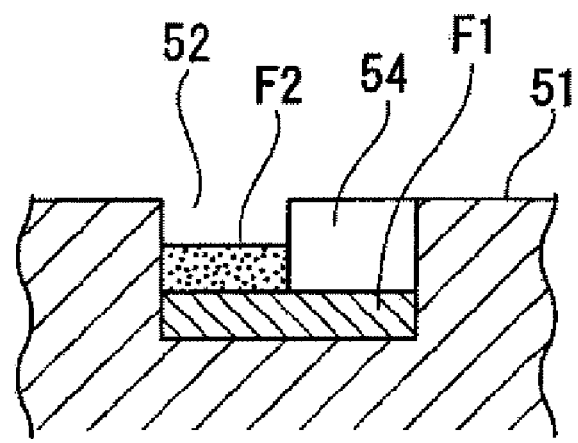
Figure 9B:
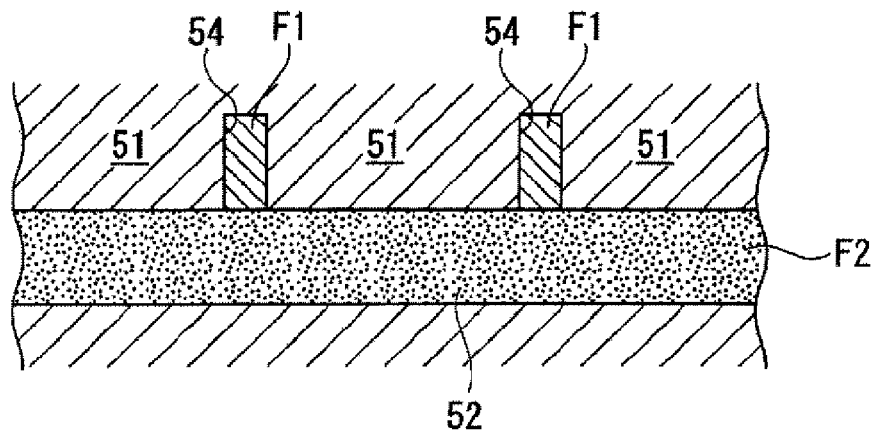

Then, the drying and firing treatments are carried out to remove the dispersion medium. As a result, the silver layer F2, which is disposed on the nickel layer F1 in the opening 52 in a layered state, and is disposed on the nickel layer F1 in the opening 54 in a non-layered state, is formed as shown in FIG. 9B and FIG. 8B.

Figure 10A:
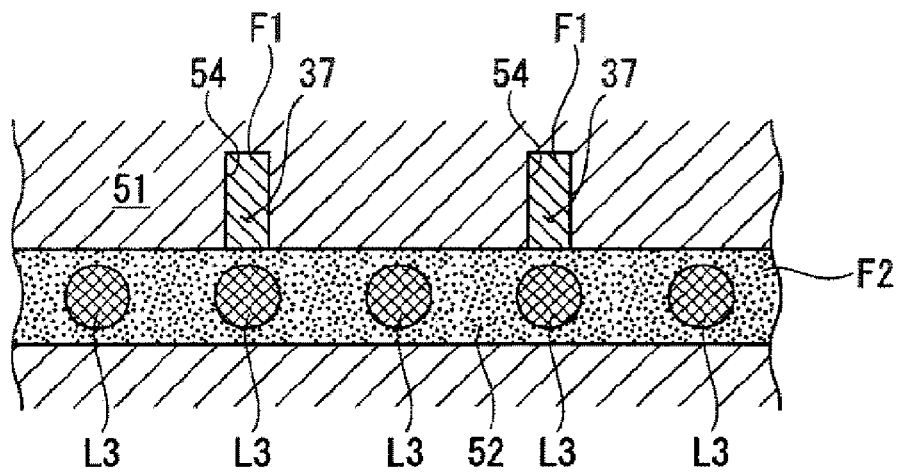
FIGS. 10A and 10B illustrate the procedure to form the gate wiring line and the gate electrode.

Then, in order to form the silver layer F3, a droplet of a functional liquid L3 is disposed to a predetermined position (a position similar to those in forming the nickel layer F1 and the silver layer F2) on the silver layer F2 of the opening 52 with the droplet discharge head 301 as shown in FIG. 10A. In the functional liquid L3, nickel serving as a conductive fine particle is dispersed in an aquatic dispersion medium. This is similar to a case when the functional liquid L2 is discharged. The functional liquid L3 wets and spreads only in the opening 52 by an autonomous flow, but does not flow in the opening 54 since the functional liquid L3 contains the aquatic dispersion medium and the bank 51, which forms the opening 54 having a narrow width, has lyophobicity.

Figure 8C:
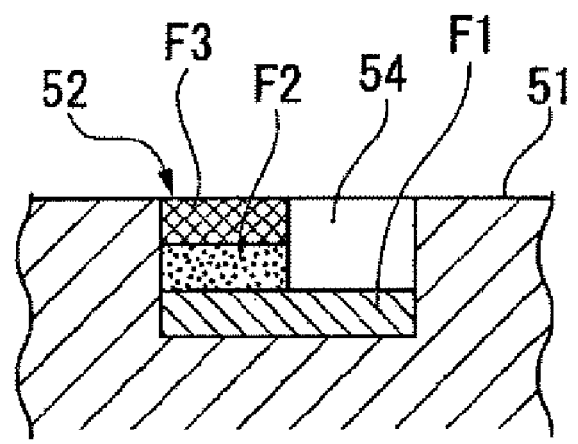
Figure 10B:
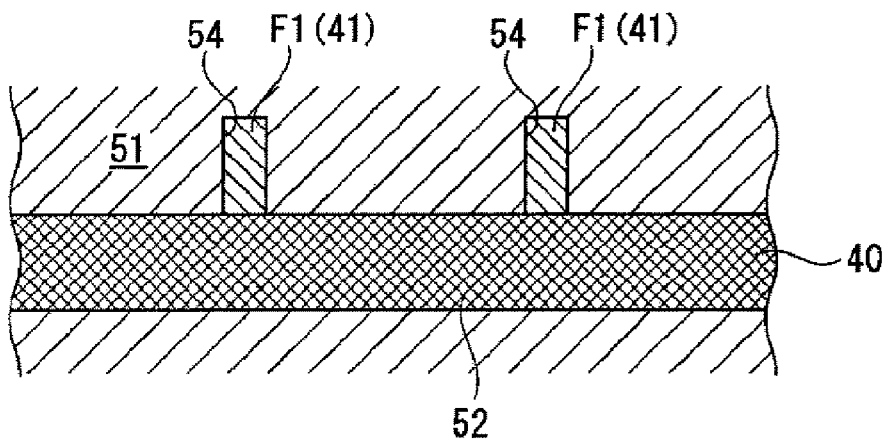

Then, the drying and firing treatments are carried out to remove the dispersion medium. As a result, the silver layer F3, which is disposed on the silver layer F2 in the opening 52 in a layered state, and is disposed on the nickel layer F1 in the opening 54 in a non-layered state, is formed as shown in FIG. 10B and FIG. 8C.

In the gate wiring line 40 formed as described above, the nickel layer F1 functions as a base layer while the nickel layer F3 functions as a protective film. The protective film functions as a thin film to suppress an electro migration phenomenon or the like of a conductive film made of silver, copper, or the like. The nickel layer F1 also functions as the gate electrode 41 in the opening 54.

The second process to form multilayered part.

FIGS. 11A through 14C illustrate a multilayered part forming process, which is the second process. FIGS. 11B, 12B, 13B, and 14B are sectional views taking along the line A-A' of FIGS. 11A, 12A, 13A, and 14A respectively. FIGS. 12C, 13C, and 14C are sectional views taking along the line B-B' of FIGS. 12A, 13A, and 14A respectively.

In the second process, the multilayered part 35, which is layered with an insulation film 31 and a semiconductor film (a contact layer 33 and an active layer 32), is formed on a predetermined position on a layer including the bank 51 and the wiring lines of a grid pattern.

First, the insulation film 31, the active layer 32, and the contact layer 33 are sequentially formed on the entire surface of the substrate P by a plasma CVD method. Specifically, a silicon nitride film as the insulation film 31, an amorphous silicon film as the active layer 32, and an n+ silicon film as the contact layer 33 are sequentially formed as shown in FIGS. 11A and 11B by changing a raw material gas and plasma generating conditions.

Then, a resist 58 (58a through 58c) is disposed on a predetermined position as shown in FIGS. 12A, 12B, and 12C by using photolithography. The predetermined position is the following as shown in FIG. 12A: on the intersection part 56 (the resist 58a), at which the gate wiring line 40 and the source wiring line 42 are intersected; on the gate electrode 41 (the resist 58c); and on the capacitance line 46 (the resist 58b).

Here, the resist 58a disposed on the intersection part 56 and the resist 58b disposed on the capacitance line 46 are disposed and formed apart from each other so as not to touch each other. As shown in FIG. 12B, a groove 59 is formed to the resist 58c disposed on the gate electrode 41 by performing a half exposure.

Next, the entire surface of the substrate P is subjected to an etching treatment so as to remove the contact layer 33 and the active layer 32 with the resist 58 (58a through 58c) as a mask. The etching treatment is further carried out so as to remove the insulation film 31.

Figure 13C:
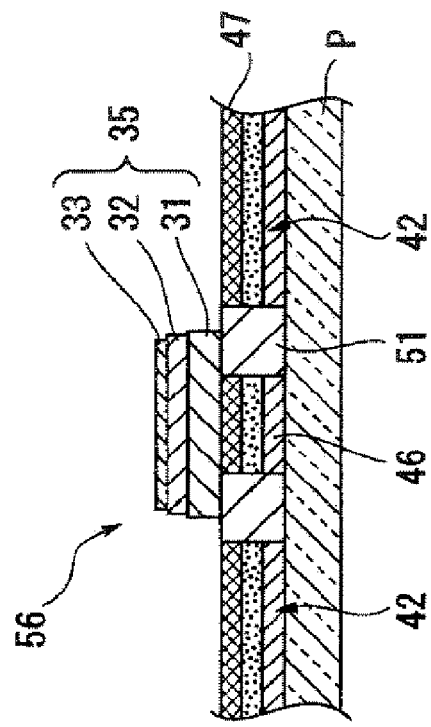
FIGS. 13A, 13B and 13C illustrate a process following FIGS. 12A, 12B and 12C.
Figure 13B:
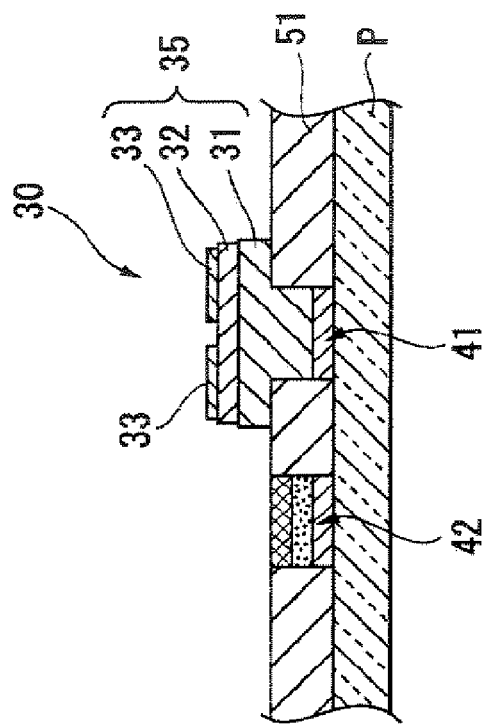
Figure 13A:
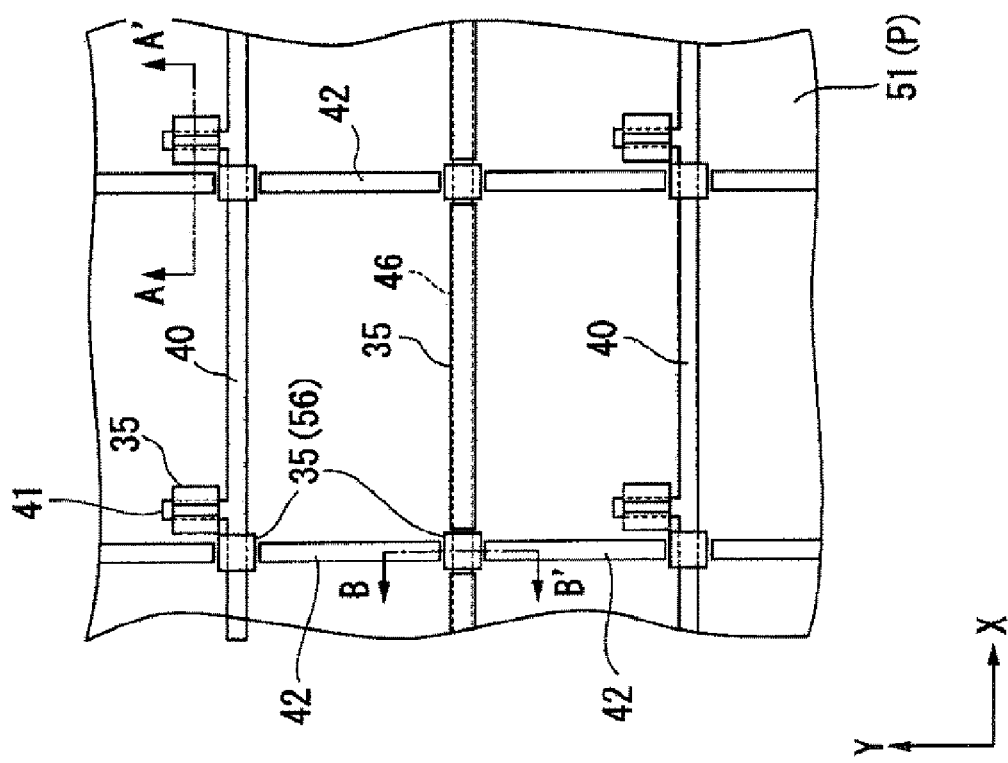

As a result, the contact layer 33, active layer 32 and the insulation layer 31 are removed from an area excluding the predetermined position on which the resist 58 (58a through 58c) is disposed, as shown in FIGS. 13A, 13B, and 13C. In contrast, formed on the predetermined position on which the resist 58 is disposed, is the multilayered part 35 layered with the insulation film 31 and the semiconductor film (the contact layer 33 and the active layer 32).

In the multilayered part 35 formed on the gate electrode 41, the bottom of the groove 59 is removed by a development carried out again before etching, since the groove 59 has formed to the resist 58c by a half exposure. Accordingly, the part corresponding to the groove 59 of the contact layer 33 is removed, resulting in the contact layer 33 being formed as divided into two parts as shown in FIG. 13B. As a result, the TFT 30, in which the active layer 32, the contact layer 33, and the gate electrode 41 are layered, is formed as a switching element.

Then, as shown in FIGS. 14A, 14B, and 14C, a silicon nitride film is formed on the entire surface of the substrate P as a protective film 60 protecting the contact layer 33.

Consequently, the multilayered part 35 is formed.

The Third Process

FIGS. 15A through 17C are diagrams illustrating the third process to form the pixel electrode 45 and the like. FIGS. 15B, 16B, and 17B are sectional views taking along the line A-A' of FIGS. 15A, 16A, and 17A respectively. FIGS. 15C, 16C, and 17C are sectional-views taking along the line B-B' of FIGS. 15A, 16A, and 17A respectively.

In the third process, the source electrode 43, the drain electrode 44, a connection layer 49 and the pixel electrode 45 are formed.

The source electrode 43, the drain electrode 44, the connection layer 49 and the pixel electrode 45 can be formed by a transparent material such as indium tin oxide (ITO). The droplet discharge method is also employed to form those electrodes in the same manner as the first process.

First, the bank 61 is formed by photolithography so as to cover the gate wiring line 40, the source wiring line 42, and the like. Namely, as shown in FIGS. 15A, 15B, and 15C, the bank 61 of nearly a grid shape is formed. An opening 62 is formed on the source wiring line 42, the gate wiring line 40, and at the intersection part 56 where the source wiring line 42 and the capacitance line 46 are intersected.

The opening 62 is also formed so that a part of the multilayered part 35 (TFT 30) formed on the gate electrode 41 is exposed as shown in FIG. 15B. Namely, the bank 61 divides the multilayered part 35 (TFT 30) into two parts in the X-direction.

Examples of materials for the bank 61 include polymer materials such as an acrylic resin, a polyimide resin, an olefin resin, and a melamine resin as the same as those for bank 51. A lyophobic treatment is also performed in the same manner as the bank 51.

The opening 62 formed by the bank 61 corresponds to the connection layer 49 joining the source wiring lines 42 separated or the position to form the source electrode 43. The area surrounded by the bank 61 corresponds to the position to form the pixel electrode 45 and the drain electrode 44. Namely, the connection layer 49 joining the source wiring lines 42 separated, the source electrode 43, the drain electrode 44, and the pixel electrode 45 are formed by disposing a transparent conductive material inside the opening 62 of the bank 61 and the bank 61. Inside the opening 62, a conductive material other than the transparent conductive material may be disposed.

Figure 16B:
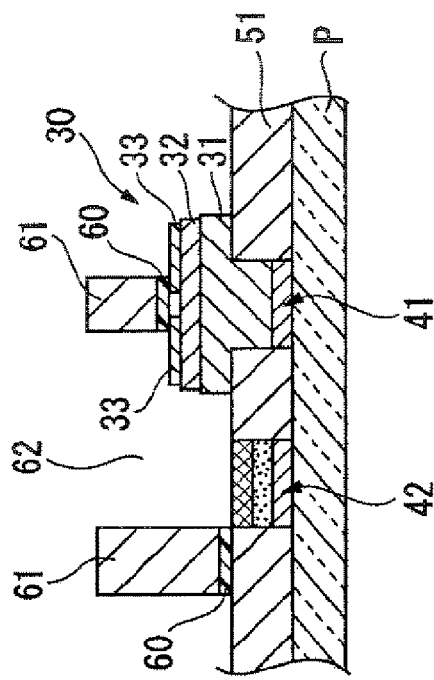
FIGS. 16A, 16B and 16C illustrate a process following FIGS. 15A, 15B and 15C.
Figure 16C:
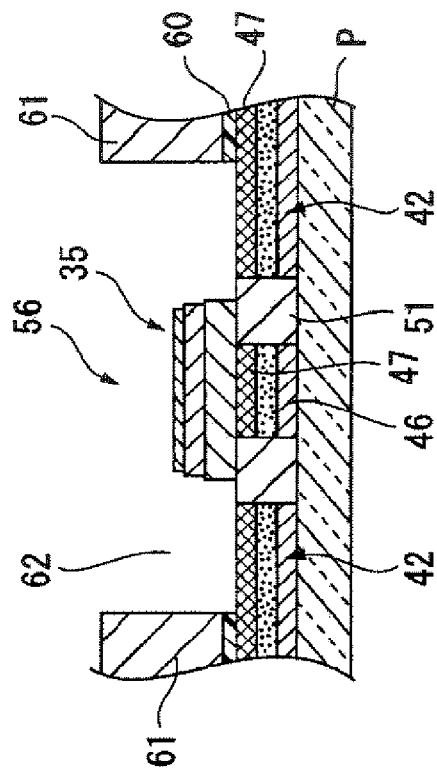
Figure 16A:
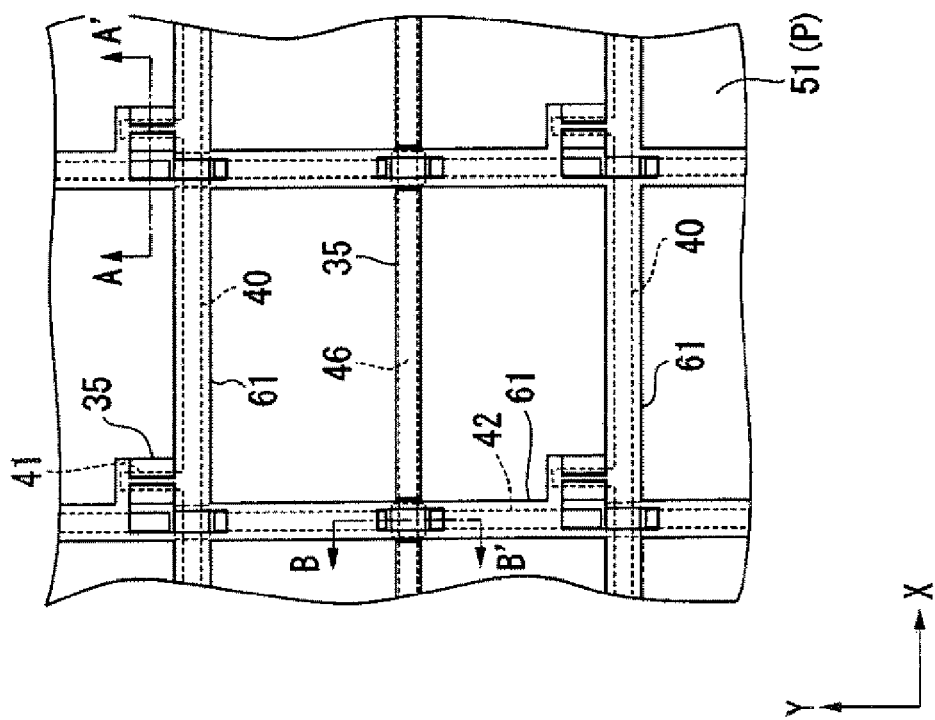

Then, the protective film 60 formed on the entire surface of the substrate P is removed by etching using the bank 61 as a mask. As a result, the protective layer 60 formed on an area where the bank 61 is not disposed is removed as shown in FIGS. 16A, 16B, and 16C. A metal protective film 47 formed on the wiring lines of a grid pattern is also removed.

Then, a transparent conductive material is discharged and disposed inside the opening 62 of the bank 61 and the area surrounded by the bank 61 by the droplet discharge device IJ. The transparent conductive material is a dispersion liquid in which conductive fine particles of ITO are dispersed in a dispersion medium.

Drying and firing treatments to remove the dispersion medium follow the discharge of the wiring line ink to the substrate P, if necessary. The drying and firing treatments secure the electrical contact between conductive fine particles, thereby the functional liquid L1 disposed turns to a conductive film.

Consequently, as shown in FIGS. 17A, 17B, and 17C, the connection layer 49 joining the source wiring lines 42 separated, the source electrode 43, the drain electrode 44, and the pixel electrode 45 are formed on the substrate P, resulting in the active matrix substrate 20 being manufactured.

In the embodiment, a transparent conductive material is discharged and disposed inside the opening 62 of the bank 61, and the area surrounded by the bank 61. However, a conductive material such as silver and copper also can be used for the connection layer 49 joining the source wiring lines 42 separated, and the source electrode 43 when connection resistance is emphasized.

While a transparent conductive material is disposed by a droplet discharged method in the embodiment, it may be disposed by spattering and etching. In this case, the bank 61 is not required.

As described above, a wiring pattern having excellent flatness and density can be formed without having a rough surface caused by a material such as silver, which deteriorates its flatness when it is heated, since the gate electrode 41 is formed as a one-layer structure of the nickel layer F1 in the embodiment.

Accordingly, flatness of the TFT 30, to which flatness of the gate electrode 41 disposed on the gate electrode 41 is transferred, also can be improved in the embodiment. Particularly, in the TFT 30 having a bottom gate structure, an electron flow is inhibited if an electron transfer distance is long due to low flatness of the active layer 32, since electrons flow in the vicinity of the interface of the insulation film 31 in the active layer 32 of amorphous silicon film serving as a channel. Consequently, advancing flatness of the gate electrode 41 serving as a base layer of the active layer 32 flats the active layer 32 so as to flow electrons smoothly, resulting in the characteristics of the TFT 30 being improved.

In the embodiment, the functional liquid L1 disposed to the opening 52 flows to the opening 54 to be disposed. This makes it possible to fill a functional liquid to the opening 54, the width of which is even narrower than the diameter of the discharged droplet, for example. As a result, a fine pattern can easily be formed.

In the embodiment, the number of processes combining dry processing and photolithographic etching can be reduced. Namely, since the gate wiring line 40 and the source wiring line 42 are formed at one time, the number of processes combining dry processing and photolithographic etching can be reduced by one time. In addition, the number of processes combining dry processing and photolithographic etching can further be reduced by disposing a conductive material on to the substrate P by using a droplet discharge method in the first or the third process.

In the embodiment, a setback in which a current flowing in the source wiring line 42 runs into the multilayered part 35 on the capacitance line 46 can be avoided, since the multilayered part 35 (the insulation film 31, active layer 32, and the contact layer 33) is formed on the capacitance line 46 so as not to touch the multilayered part 35 formed on the intersection part 56.

Here, the contact layer 33 is a conductive film. Formed on the multilayered part 35 (the contact layer 33) on the intersection part 56 is the connection layer 49 joining the source wiring lines 42. Thus, a current flowing in the source wiring line 42 also flows in the contact layer 33. Accordingly, if the multilayered part 35 on the capacitance line 46 contacts the multilayered part 35 on the intersection part 56, a phenomenon occurs in which a current flowing in the source wiring line 42 runs into the multilayered part 35 on the capacitance line 46 as described above.

The active matrix substrate 20 according to the invention can avoid such setback, thereby enabling a desired performance to be demonstrated.

Electro-Optical Device

A liquid crystal display 100 as an example of an electro-optical device using the active matrix substrate 20 will now be described.

Figure 18:
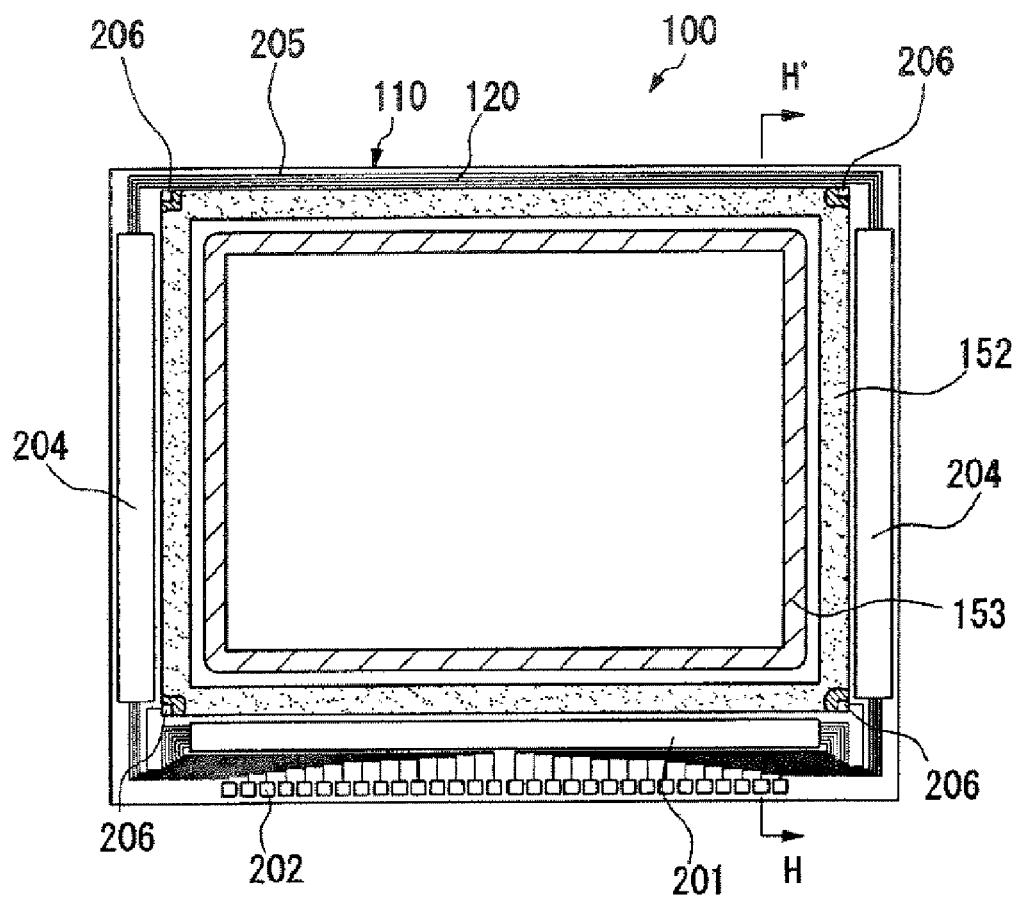
FIG. 18 is a plan view illustrating a liquid crystal display viewed from a counter substrate.
Figure 19:
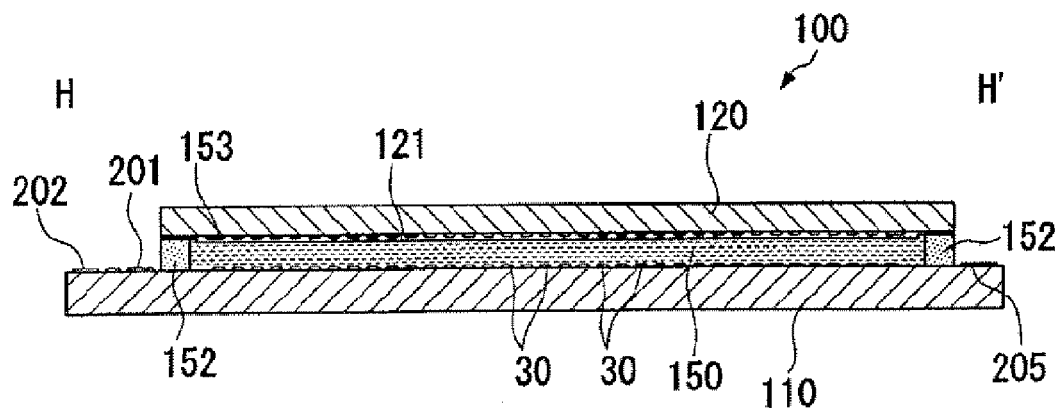
FIG. 19 is a sectional-view of the liquid crystal display.

FIG. 18 is a plan view of the liquid crystal display 100 viewed from a counter substrate. FIG. 19 is a sectional-view taken along the line H-H' of FIG. 18.

It should be noted that different scales are used for the layers and members in the drawings, so that the layers and members can be recognized.

Referring to FIGS. 18 and 19, in the liquid crystal display (electro-optical device) 100, a TFT array substrate 110 including the active matrix substrate 20 and the counter substrate 120 are bonded with a sealant 152, which is a photocurable sealant, interposed therebetween. In an area defined by the sealant 152, a liquid crystal 150 is sealed and kept. The sealant 152 is formed in a frame shape closed in an area of the substrate surface. The sealant 152 has no liquid crystal injection inlet and no trace sealed with a sealing material.

In a region inside the area where the sealant 152 is provided, a peripheral light-blocking film 153 made of a light-blocking material is provided. In an area outside the sealant 152, a data line driving circuit 201 and a mount terminal 202 are provided along one side of the TFT array substrate 110. Provided along two sides adjacent to the one side are scanning line driving circuits 204. Provided along another side of the TFT array substrate 110 are a plurality of wiring lines 205 to connect the scanning line driving circuits 204 provided to the both sides of an image display area. At one or more of the corners of the counter substrate 120, an inter-substrate conductive material 206 is disposed to provide electrical conductivity between the TFT array substrate 110 and the counter substrate 120.

In this regard, instead of providing the data line driving circuit 201 and the scanning line driving circuits 204 on the TFT array substrate 110, a tape automated bonding (TAB) substrate on which a driving LSI is mounted and a group of terminals provided around the TFT array substrate 110 may be electrically and mechanically connected with an anisotropic conductive film interposed therebetween.

Note that a retardation film, a polarizer, etc., included in the liquid crystal display 100 are disposed in a predetermined direction (not shown) depending on the type of the liquid crystal 150, i.e., operation modes including twisted nematic (TN) mode, a C-TN method, a VA method, and an IPS method, and normally white mode or normally black mode.

If the liquid crystal display 100 is provided as a color display, red (R), green (G) and blue (B) color filters, for example, and their protective films are provided in an area in the counter substrate 120 opposing to each pixel electrode in the TFT array substrate 110.

In addition, the active matrix substrate 20 can be applied to an organic electroluminescent (EL) display as an electro-optical device, for example.

An EL display is an element in which a thin film containing fluorescent inorganic and organic compounds are sandwiched between a cathode and an anode, By injecting electrons and holes into the thin film to excite them and thus generate excitons, the element emits light by means of light emission (fluorescence/phosphorescence) when the excitons are recombined.

Among fluorescent materials used for an organic EL display element, materials exhibiting luminescent colors of red, green and blue, i.e., materials for forming a light-emitting layer and a hole injection/electron transport layer are used as ink. The materials are patterned on the active matrix substrate 20 including the TFT 30 so as to manufacture a light-emitting full color EL display.

The active matrix substrate 20 is also applicable to plasma display panels (PDPs) and surface-conduction electron emission elements that use a phenomenon of emitting electrons by passing a current through in parallel with the surface of a thin film formed on a substrate with a small area.

Electronic Apparatus

Next, specific examples of an electronic apparatus of the invention will be described.

Figure 20A:
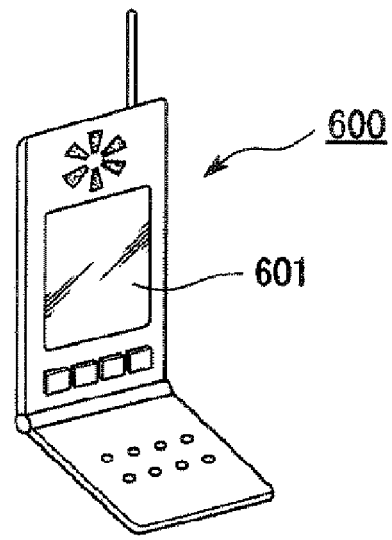
FIGS. 20A, 20B, and 20C illustrate specific examples of electronic apparatuses.

FIG. 20A is a perspective view illustrating an example of cellular phones. Referring to FIG. 20A, a cellular phone 600 includes a liquid crystal display unit 601 having the liquid crystal display 100.

Figure 20B:
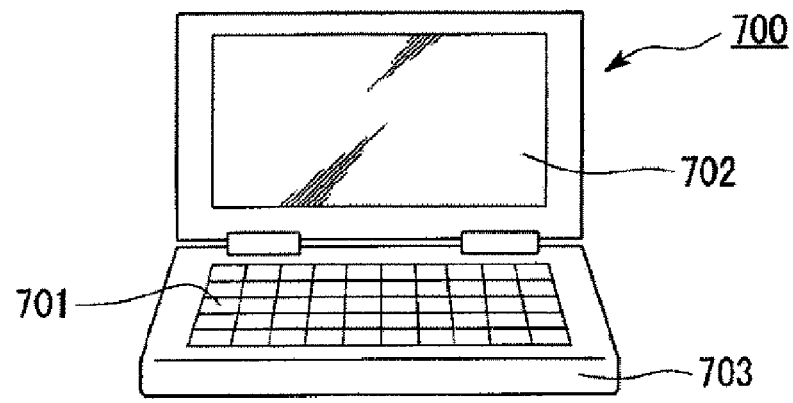

FIG. 20B is a perspective view illustrating an example of portable information processing devices such as word processors and personal computers. Referring to FIG. 20A, an information processing device 700 includes an input unit 701 such as a keyboard, an information processor body 703, and a liquid crystal display unit 702 provided with the liquid crystal display 100.

Figure 20C:
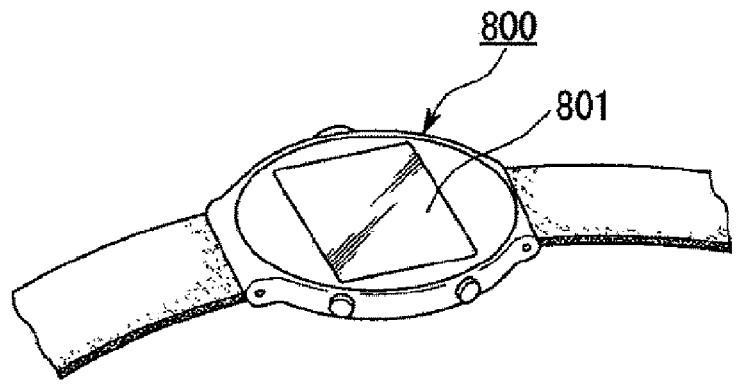
Figure 21:
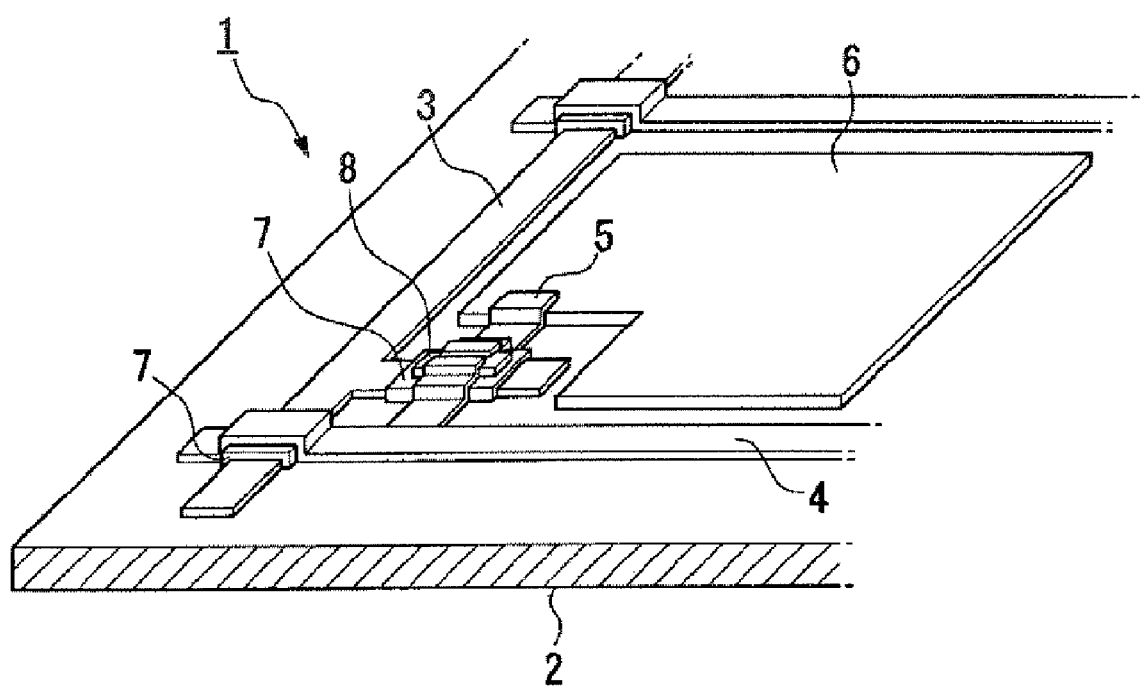
FIG. 21 illustrates a related art active matrix substrate.

FIG. 20C is a perspective view illustrating an example of wristwatch type electronic apparatuses. Referring to FIG. 20C, a wristwatch 800 includes a liquid crystal display unit 801 provided with the liquid crystal display 100.

Since the electronic apparatuses shown in FIGS. 20A through 20C include the liquid crystal display 100, miniaturization and high quality can be achieved.

The embodiment also can be applied to large-size liquid crystal displays such as televisions and monitors.

The electronic apparatus of another embodiment of the invention is provided with the liquid crystal 100, but it can be provided with other electro-optical devices such as organic electroluminescent displays and plasma displays.

While the preferred embodiments according to the invention are described referring to the accompanying drawings, it is understood that the invention is not limited to these examples. The shapes, combinations and the like of each component member described in the foregoing embodiments are illustrative only, and various modifications may be made based on design requirement and the like within the scope of the invention.

For example, while the source wiring line 42 is separated at the intersection part 56 in the embodiment, the gate wiring line 40 may be separated at the intersection part 56. In addition, while the setback in which a current flowing in the source wiring line 42 runs into the multilayered part 35 on the capacitance line 46 is avoided by not touching the multilayered part 35 on the capacitance line 46 to the multilayered part 35 on the intersection part 56, the setback may be avoided by concurrently removing the contact layer 33 of the multilayered part 35 on the intersection part 56 when the TFT 30 is formed.

What is claimed is:

1. A method for manufacturing an active matrix substrate, comprising:
    forming a first conductive layer across a first wiring line forming area and a second wiring line forming area on a substrate including a first wiring line and a second wiring line having a width narrower than a width of the first wiring line; and
    forming a second conductive layer on the first conductive layer formed in the first wiring line forming area in a layered state, and on the first conductive layer formed in the second wiring line forming area in a non-layered state, wherein the first conductive layer is formed by discharging a first droplet containing a first conductive material and an organic solvent while the second conductive layer is formed by discharging a second droplet containing a second conductive material and an aquatic solvent, wherein the first conductive layer is the second wiring line forming area is formed by flowing the first droplet discharge to the first wiring line forming area to the second wiring line forming area.

2. The method for manufacturing an active matrix substrate according to claim 1, further comprising forming a switching element on at least a part of the second wiring line.

3. The method for manufacturing an active matrix substrate according to claim 1, further comprising:
    forming a wiring pattern of a grid of wiring lines, the wiring pattern including the first wiring line, and the second wiring line and one of the wiring lines intersected at an intersection part being separated;
    forming a multilayered part including an insulation film and a semiconductor film on the intersection part and on a part of the wiring pattern; and
    forming a connection layer on the multilayered part and a pixel electrode, the connection layer electrically coupling separated parts of the one of the wiring lines, and the pixel electrode being electrically coupled to the wiring pattern through the semiconductor film.

4. The method for manufacturing an active matrix substrate according to claim 3, wherein the switching element is formed by performing a half-exposure treatment to the semiconductor film.

5. The method for manufacturing an active matrix substrate according to claim 3, wherein the wiring pattern includes a source wiring line, a gate wiring line having a gate electrode, and a capacitance line extending in approximately a straight line along the gate wiring line, the source wiring line is separated at the intersection part, and the first wiring line includes the gate wiring line while the second wiring line includes the gate electrode.

* * * * *